(12) United States Patent
McNulty et al.

(10) Patent No.: US 11,614,505 B2
(45) Date of Patent: Mar. 28, 2023

(54) DEPLOYABLE GUARD FOR PORTABLE MAGNETIC RESONANCE IMAGING DEVICES

(71) Applicant: Hyperfine Operations, Inc., Guilford, CT (US)

(72) Inventors: Christopher Thomas McNulty, Guilford, CT (US); Michael Stephen Poole, Guilford, CT (US)

(73) Assignee: Hyperfine Operations, Inc., Guilford, CT (US)

( * ) Notice: Subject to any disclaimer, the term of this patent is extended or adjusted under 35 U.S.C. 154(b) by 0 days.

(21) Appl. No.: 17/552,252

(22) Filed: Dec. 15, 2021

(65) Prior Publication Data

US 2022/0107374 A1    Apr. 7, 2022

Related U.S. Application Data

(63) Continuation of application No. 16/937,835, filed on Jul. 24, 2020, now Pat. No. 11,231,470, which is a
(Continued)

(51) Int. Cl.
*G01R 33/28* (2006.01)
*G01R 33/38* (2006.01)

(52) U.S. Cl.
CPC .......... *G01R 33/288* (2013.01); *G01R 33/38* (2013.01)

(58) Field of Classification Search
CPC .. G01R 33/288; G01R 33/38; G01R 33/3802; G01R 33/445
See application file for complete search history.

(56) References Cited

U.S. PATENT DOCUMENTS

| 6,317,618 | B1 | 11/2001 | Livni et al. |
| 8,473,027 | B2 | 6/2013 | Henke-Sarmento |

(Continued)

FOREIGN PATENT DOCUMENTS

| CN | 101339233 A | 1/2009 |
| CN | 101573074 B | 5/2011 |

(Continued)

OTHER PUBLICATIONS

International Search Report and Written Opinion for International Application No. PCT/US2019/028228 dated Jul. 19, 2019.
(Continued)

*Primary Examiner* — G. M. A Hyder
(74) *Attorney, Agent, or Firm* — Wolf, Greenfield & Sacks, P.C.

(57) ABSTRACT

According to some aspects, an apparatus is provided comprising a deployable guard device, configured to be coupled to a portable medical imaging device, the deployable guard device further configured to, when deployed, inhibit encroachment within a physical boundary with respect to the portable medical imaging device. According to some aspects, an apparatus is provided comprising a deployable guard device, configured to be coupled to a portable magnetic resonance imaging system, the deployable guard device further configured to, when deployed, demarcate a boundary within which a magnetic field strength of a magnetic field generated by the portable magnetic resonance imaging system equals or exceeds a given threshold.

22 Claims, 28 Drawing Sheets

Related U.S. Application Data continuation of application No. 16/389,004, filed on Apr. 19, 2019, now Pat. No. 10,761,156.

(60) Provisional application No. 62/660,692, filed on Apr. 20, 2018.

(56) References Cited

U.S. PATENT DOCUMENTS

| | | |
|---|---|---|
| 9,541,616 B2 | 1/2017 | Rothberg et al. |
| 9,547,057 B2 | 1/2017 | Rearick et al. |
| 9,585,574 B2 | 3/2017 | Nelson |
| 9,625,544 B2 | 4/2017 | Poole et al. |
| 9,645,210 B2 | 5/2017 | McNulty et al. |
| 9,817,093 B2 | 11/2017 | Rothberg et al. |
| 10,145,913 B2 | 12/2018 | Hugon et al. |
| 10,145,922 B2 | 12/2018 | Rothberg et al. |
| 10,222,434 B2 | 3/2019 | Poole et al. |
| 10,274,561 B2 | 4/2019 | Poole et al. |
| 10,281,540 B2 | 5/2019 | Mileski et al. |
| 10,281,541 B2 | 5/2019 | Poole et al. |
| 10,310,037 B2 | 6/2019 | McNulty et al. |
| 10,416,264 B2 | 9/2019 | Sofka et al. |
| 10,551,452 B2 | 2/2020 | Rearick et al. |
| 10,591,561 B2 | 3/2020 | Sacolick et al. |
| 10,709,387 B2 | 7/2020 | Poole et al. |
| 10,761,156 B2 | 9/2020 | McNulty et al. |
| 11,231,470 B2 | 1/2022 | McNulty et al. |
| 2003/0058097 A1 | 3/2003 | Saltzein et al. |
| 2006/0186884 A1 | 8/2006 | Mallett et al. |
| 2009/0009170 A1 | 1/2009 | Tigwell et al. |
| 2009/0054751 A1 | 2/2009 | Babashan et al. |
| 2014/0117989 A1 | 5/2014 | Rapoport |
| 2014/0303477 A1 | 10/2014 | Sunazuka et al. |
| 2015/0005618 A1 | 1/2015 | Dumoulin |
| 2015/0137812 A1 | 5/2015 | Rapoport |
| 2015/0253401 A1 | 9/2015 | Rapoport |
| 2016/0128592 A1 | 5/2016 | Rosen et al. |
| 2016/0131727 A1 | 5/2016 | Sacolick et al. |
| 2019/0038233 A1 | 2/2019 | Poole et al. |
| 2019/0324098 A1 | 10/2019 | McNulty et al. |
| 2019/0353723 A1 | 11/2019 | Dyvorne et al. |
| 2019/0353726 A1 | 11/2019 | Poole et al. |
| 2020/0022611 A1 | 1/2020 | Nelson et al. |
| 2020/0022612 A1 | 1/2020 | McNulty et al. |
| 2020/0034998 A1 | 1/2020 | Schlemper et al. |
| 2020/0041588 A1 | 2/2020 | O'Halloran et al. |
| 2020/0045112 A1 | 2/2020 | Sacolick et al. |
| 2020/0058106 A1 | 2/2020 | Lazarus et al. |
| 2020/0200844 A1 | 6/2020 | Boskamp et al. |
| 2020/0209334 A1 | 7/2020 | O'Halloran et al. |
| 2020/0289019 A1 | 9/2020 | Schlemper et al. |
| 2020/0289022 A1 | 9/2020 | Coumans et al. |
| 2020/0294229 A1 | 9/2020 | Schlemper et al. |
| 2020/0294282 A1 | 9/2020 | Schlemper et al. |
| 2020/0294287 A1 | 9/2020 | Schlemper et al. |
| 2020/0337587 A1 | 10/2020 | Sacolick et al. |
| 2020/0355761 A1 | 11/2020 | McNulty et al. |
| 2020/0355765 A1 | 11/2020 | Chen et al. |

FOREIGN PATENT DOCUMENTS

| | | |
|---|---|---|
| CN | 202801615 U | 3/2013 |
| CN | 103260701 A | 8/2013 |
| EP | 1 018 860 A2 | 7/2000 |
| NL | 8500275 A | 9/1986 |

OTHER PUBLICATIONS

International Preliminary Report on Patentability for International Application No. PCT/US2019/028228 dated Oct. 29, 2020.

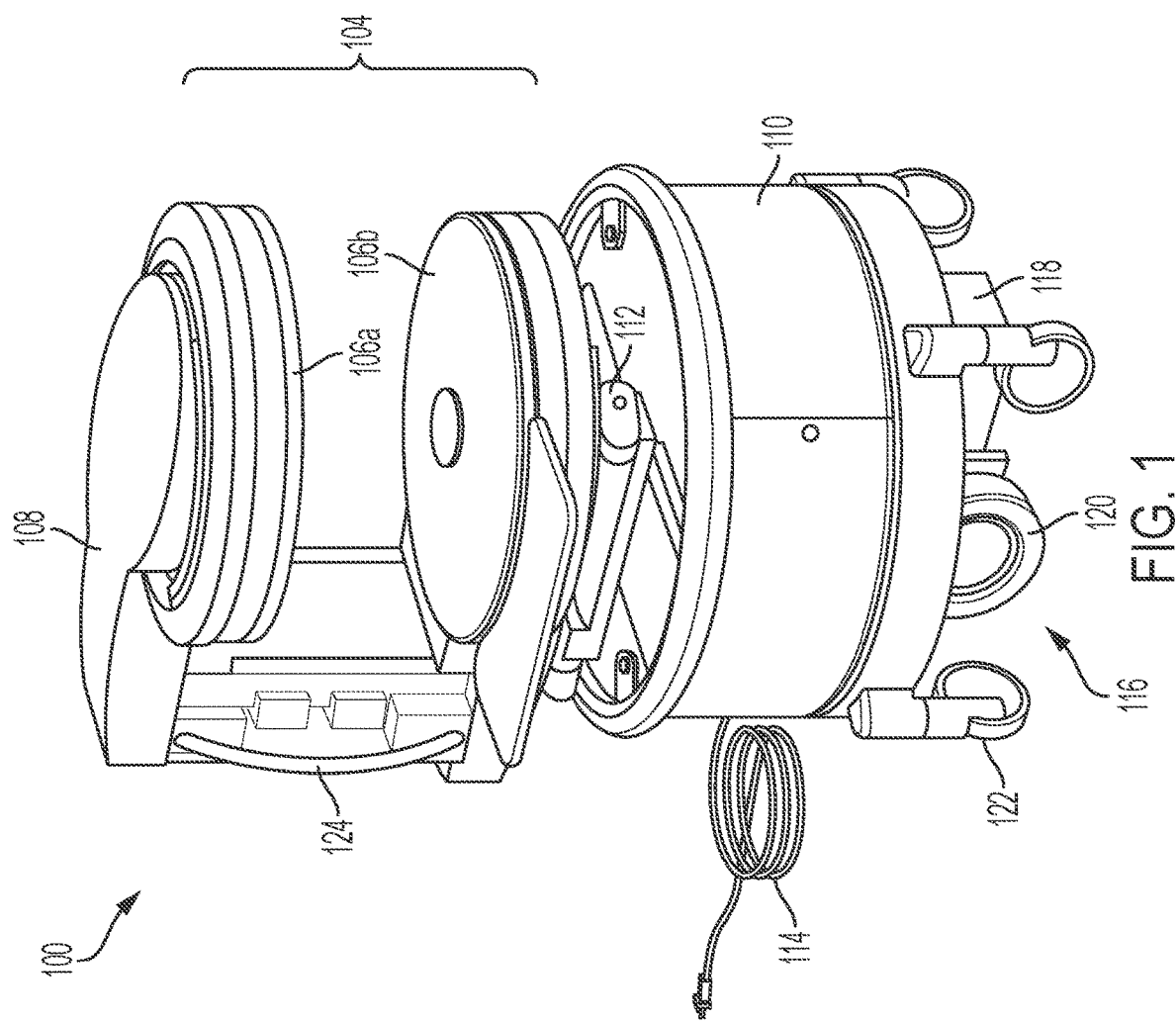

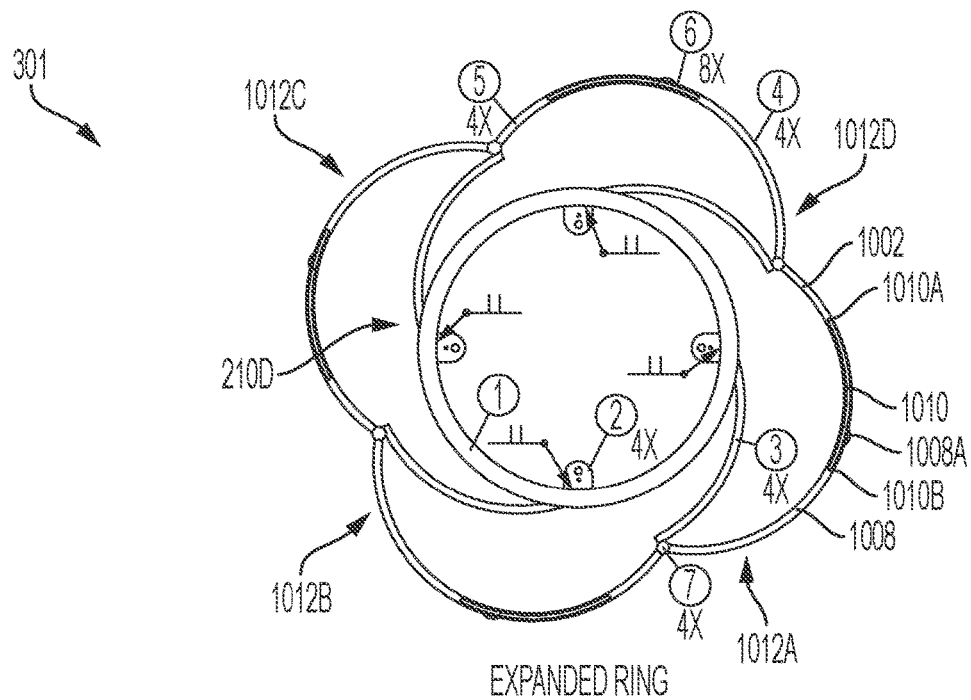
EXPANDED RING
FIG. 13A
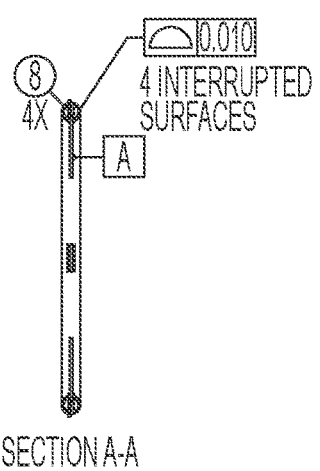
SECTION A-A
FIG. 13B
FIG. 13C
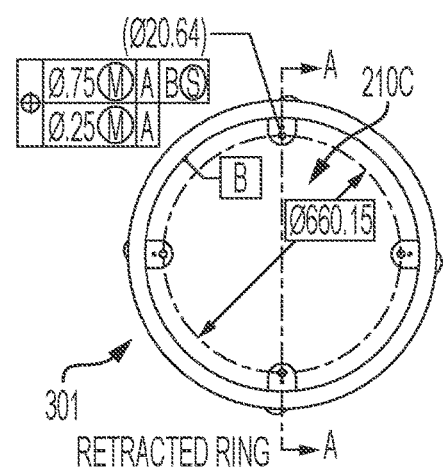
RETRACTED RING
FIG. 13D
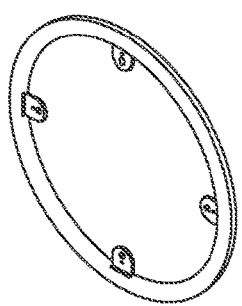
ISOMETRIC VIEW
FIG. 13E

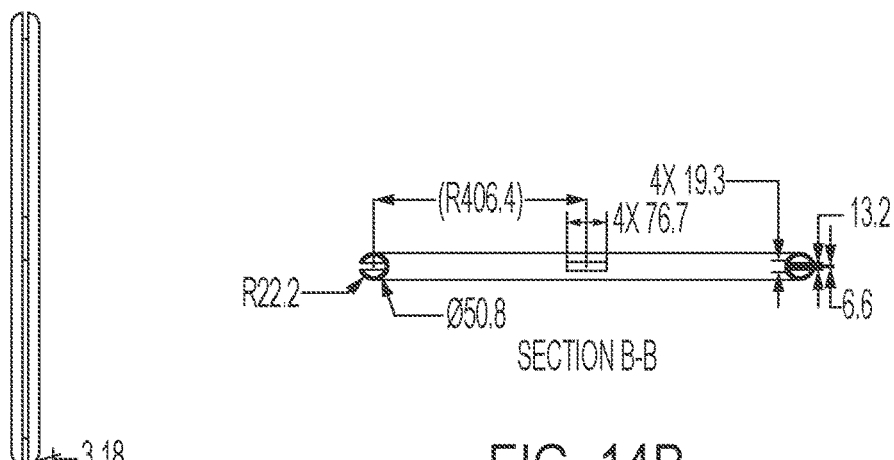
FIG. 14A
FIG. 14B
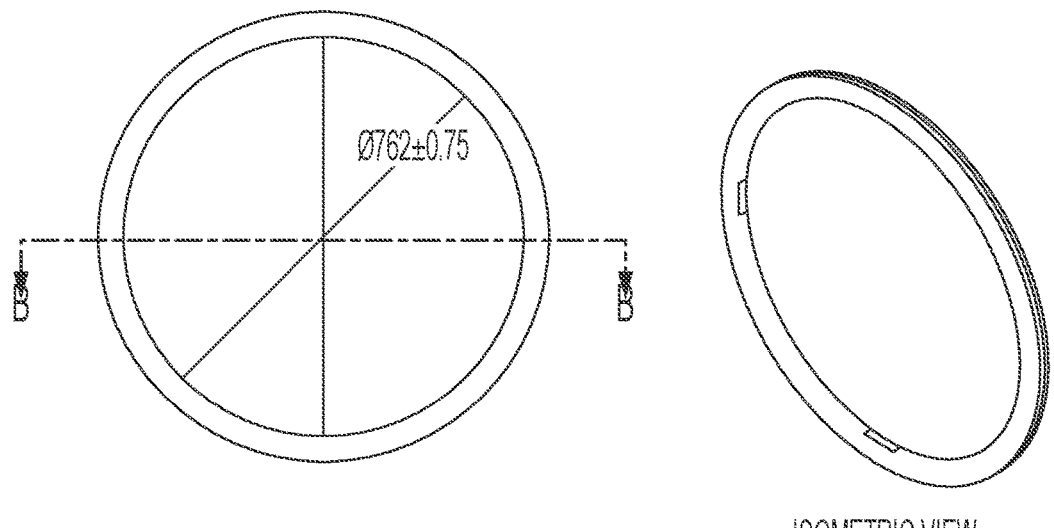
FIG. 14C
FIG. 14D

ISOMETRIC VIEW

SECTION C-C

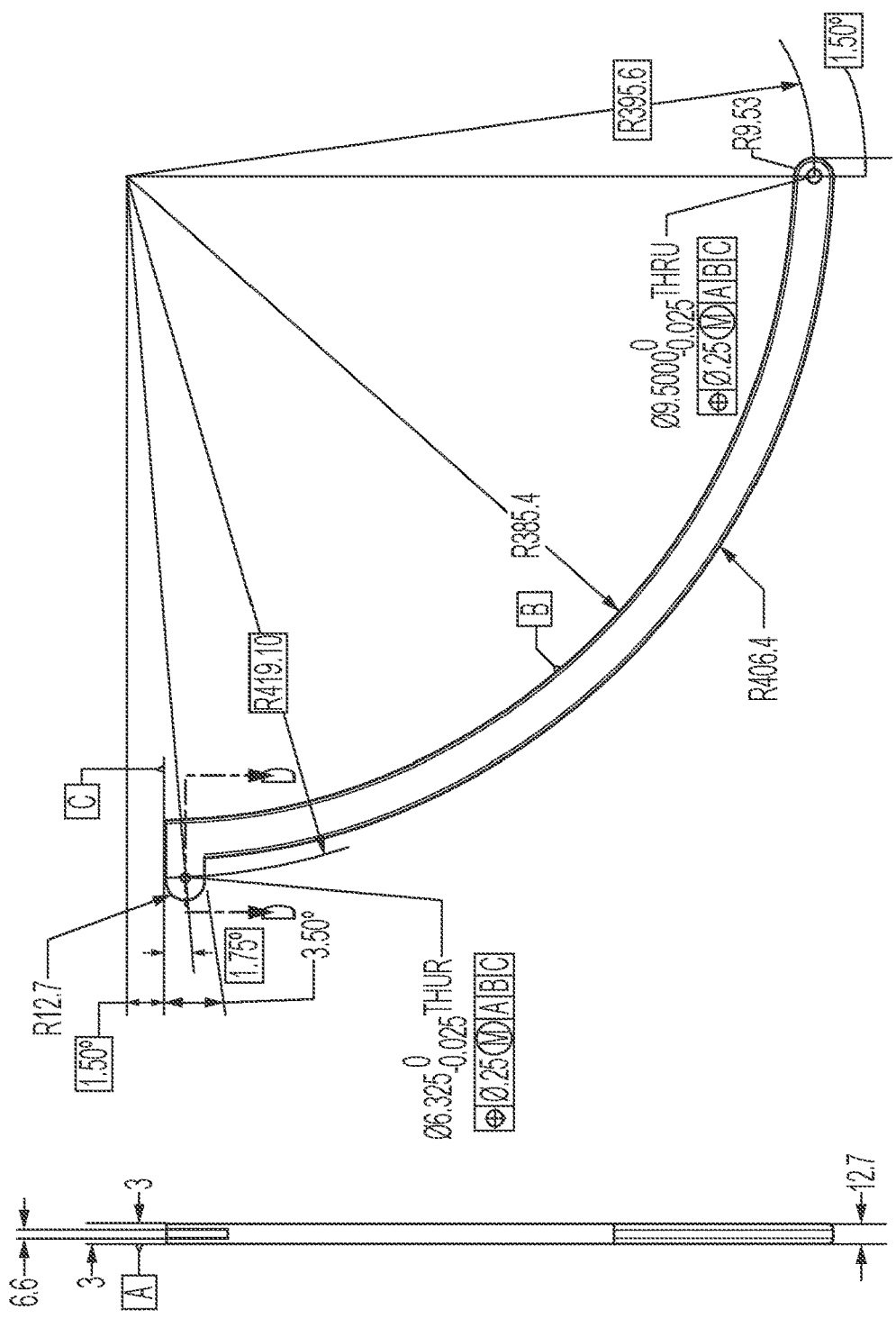

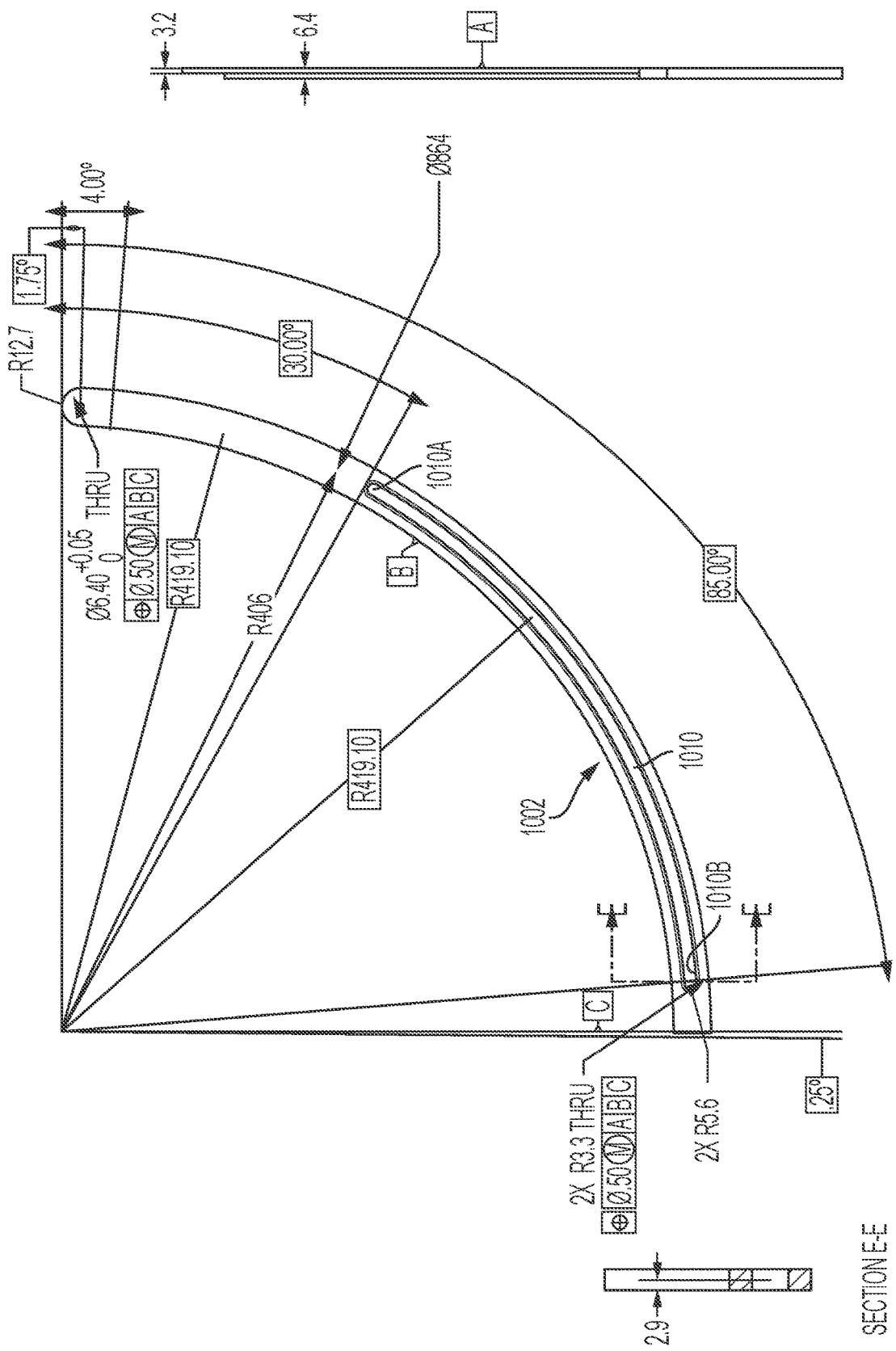

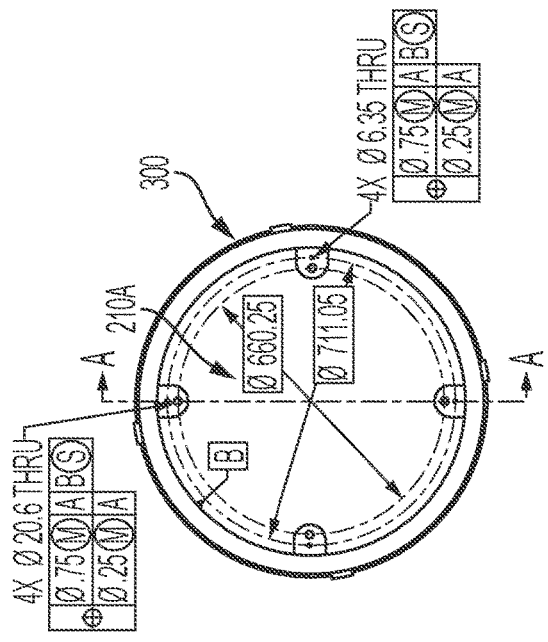
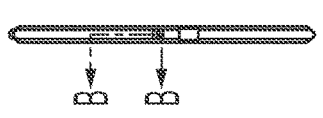
RETRACTED RING
FIG. 19B
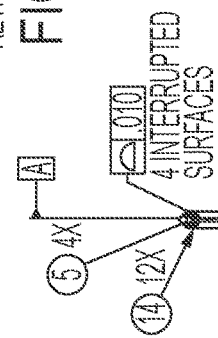
FIG. 19F
SECTION A-A
FIG. 19E
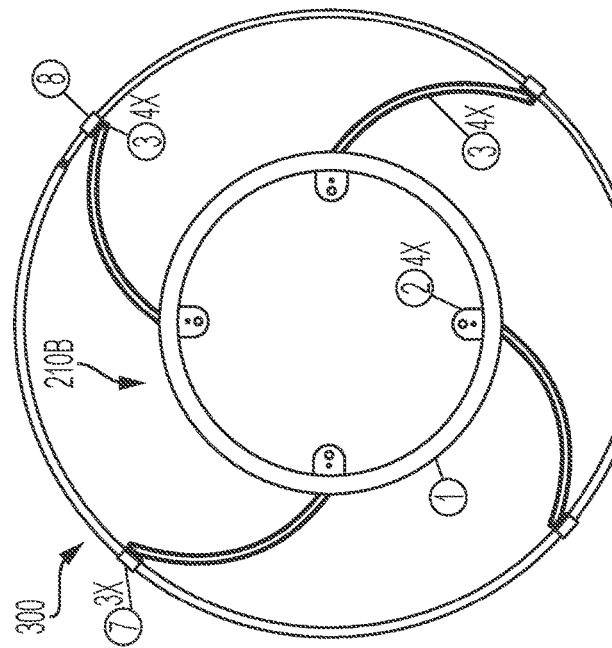
EXPANDED RING
FIG. 19A
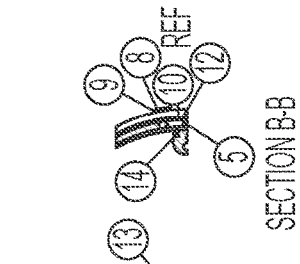
SECTION B-B
FIG. 19D
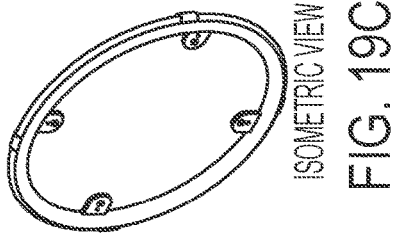
ISOMETRIC VIEW
FIG. 19C

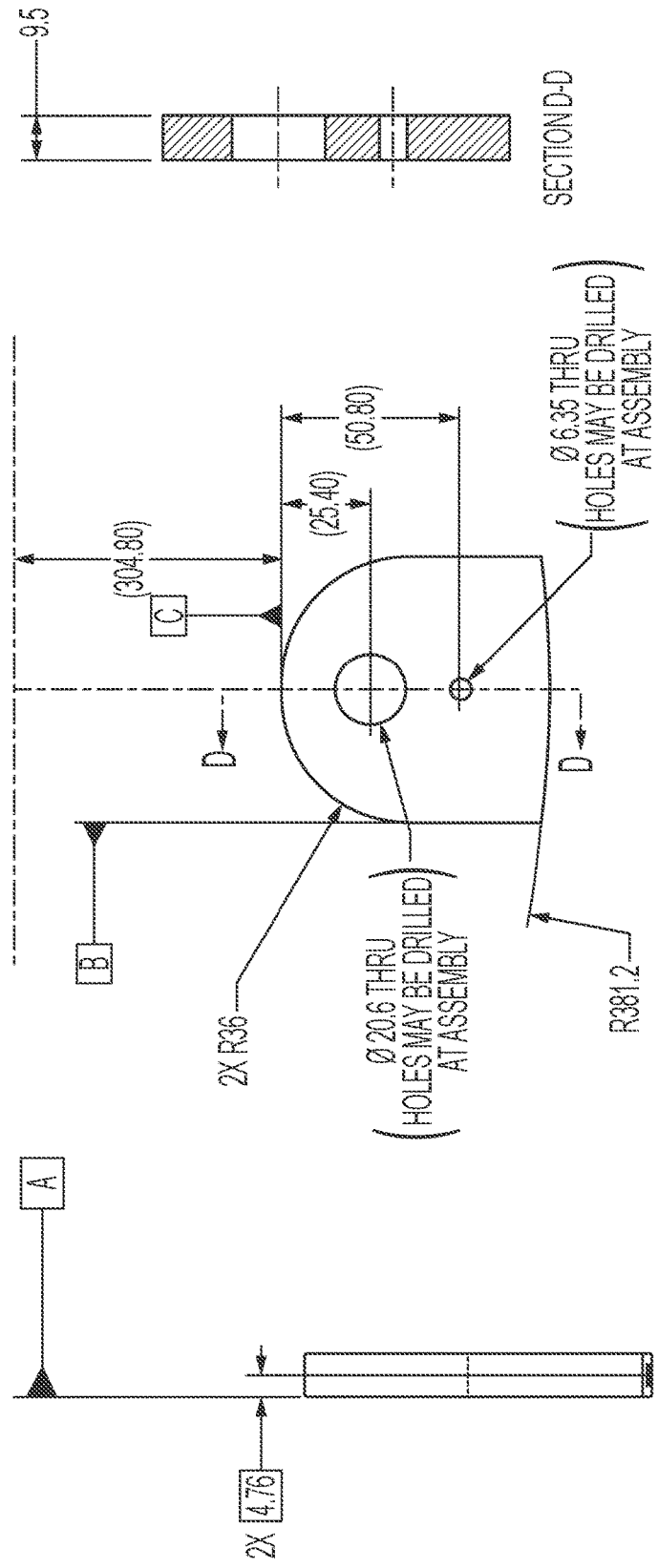
FIG. 21A
FIG. 21B
FIG. 21C
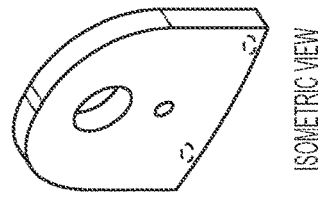
FIG. 21E
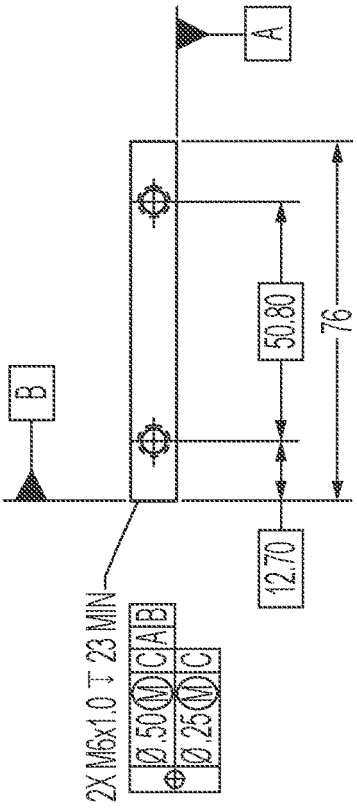
FIG. 21D

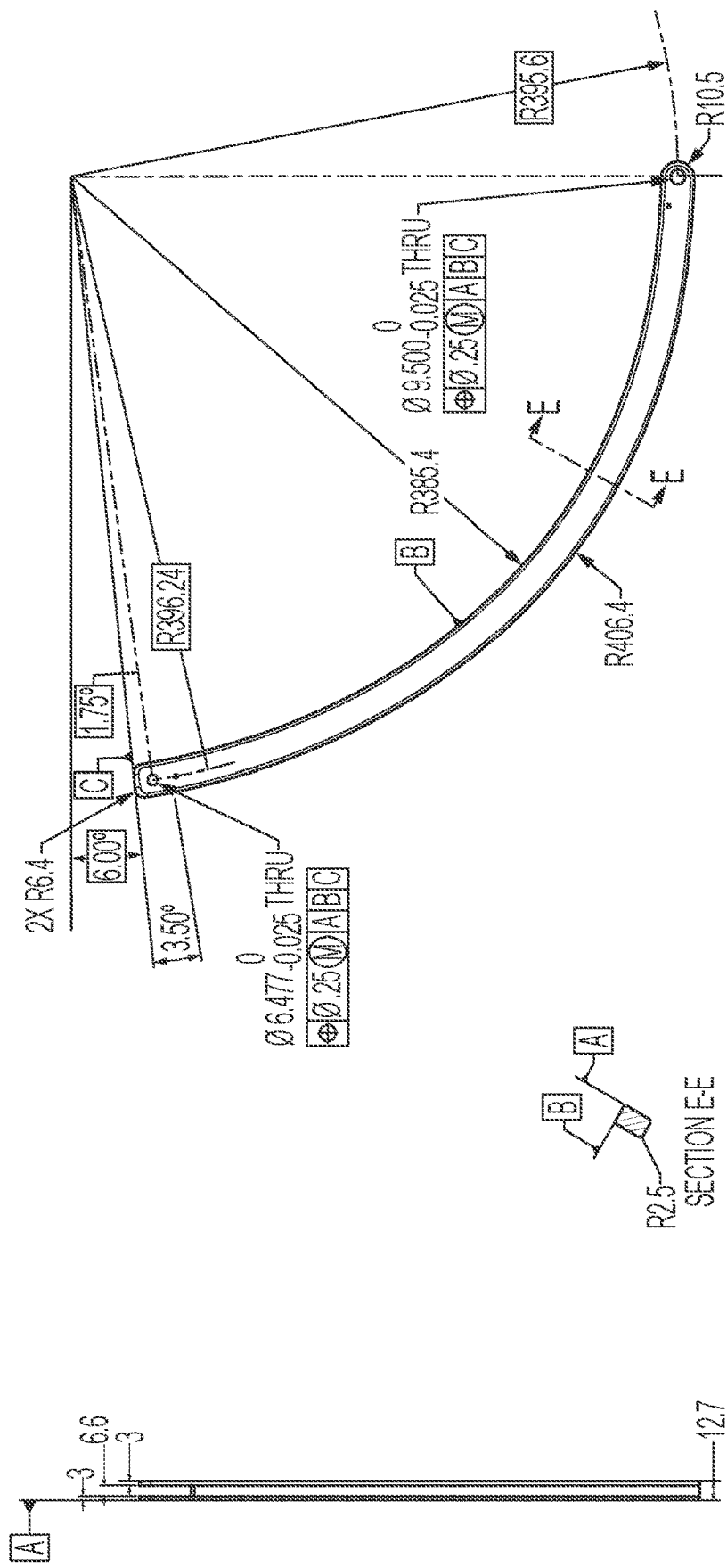

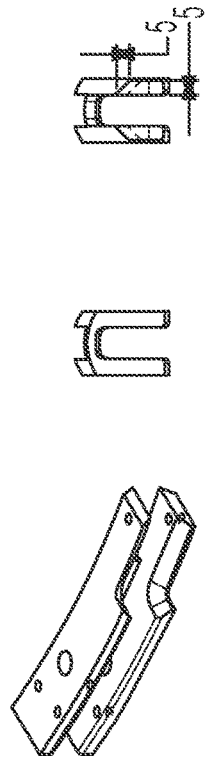
FIG. 23A
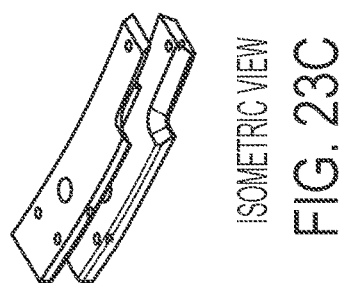
FIG. 23B
FIG. 23C
ISOMETRIC VIEW
FIG. 23D
FIG. 23E
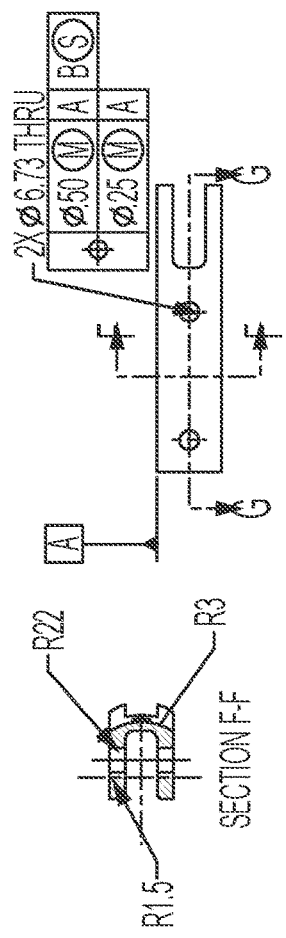
FIG. 23F
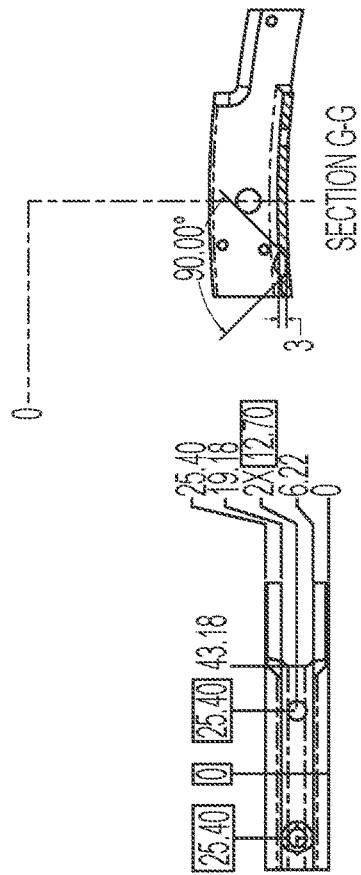
FIG. 23G
FIG. 23H
SECTION G-G

DEPLOYABLE GUARD FOR PORTABLE MAGNETIC RESONANCE IMAGING DEVICES

CROSS-REFERENCE TO RELATED APPLICATIONS

The present application is a continuation of and claims priority under 35 U.S.C. § 120 to U.S. patent application Ser. No. 16/937,835, titled "Deployable Guard For Portable Magnetic Resonance Imaging Devices", filed on Jul. 24, 2020, which is a continuation of and claims priority under 35 U.S.C. § 120 to U.S. patent application Ser. No. 16/389,004, titled "Deployable Guard For Portable Magnetic Resonance Imaging Devices", filed on Apr. 19, 2019, which claims the benefit of priority under 35 U.S.C. § 119 to U.S. Provisional Patent Application Ser. No. 62/660,692, titled "Deployable Guard For Portable Magnetic Resonance Imaging Devices", filed on Apr. 20, 2018, each of which is incorporated by reference herein in its entirety.

BACKGROUND

The present disclosure relates generally to magnetic resonance imaging (MRI) devices and, more specifically, a deployable guard suitable for use with portable MRI devices.

MRI provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability (e.g., difficulty in gaining access to clinical MRI scanners) and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is approximately one million dollars per tesla, which does not factor in the substantial operation, service, and maintenance costs involved in operating such MRI scanners.

These high-field MRI systems typically require large superconducting magnets and associated electronics to generate a strong uniform static magnetic field ($B_0$) in which an object (e.g., a patient) is imaged. The size of such systems is considerable with a typical high-field MRI installment including multiple rooms for the magnet, electronics, thermal management system, and control console areas. The size and expense of high-field MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but due to one or more of the limitations discussed above, is not practical or is impossible, as discussed in further detail below.

A further consideration related to MRI systems of any field strength are stray magnetic fields produced outside the imaging region of the MRI systems (also known as fringe fields), which are measured in Gauss. Depending on their strength, fringe fields may be dangerous to bystanders and may interfere with nearby electronics including medical devices (e.g., pacemakers) and computers (e.g., smartphones).

SUMMARY

Some embodiments include an apparatus comprising a deployable guard device, configured to be coupled to a portable medical imaging device, the deployable guard device further configured to, when deployed, inhibit encroachment within a physical boundary with respect to the portable medical imaging device.

In some embodiments, the portable medical imaging device comprises a magnetic resonance imaging (MRI) device, and the physical boundary corresponds to a volume that encompasses a region having a defined magnetic field strength. In some embodiments, the deployable guard device comprises an extendible rail. In some embodiments, the extendible rail has a first diameter in an undeployed position, and a second diameter in a deployed position, and the second diameter is greater than the first diameter. In some embodiments, the extendible rail further comprises an outer rail; and an inner rail slidingly engaged within the outer rail in a telescoping manner, such that in the undeployed position, the inner rail is disposed substantially entirely within the outer rail, and, in the deployed position, at least a portion of the inner rail is exposed. In some embodiments, the deployable guard device further comprises: a support track, configured to be secured to the portable imaging device; and one or more swing arms, connected at a first end thereof to the support track and connected to the outer rail at a second end thereof. In some embodiments, the one or more swing arms are disposed substantially within the support track when the deployable guard device is in the undeployed position. In some embodiments, the second end of the one or more swing arms arm is extended in a radially outward direction from the support track in the deployed position. In some embodiments, the defined magnetic field strength is within a range from about 1 Gauss to about 30 Gauss. In some embodiments, the defined magnetic field strength is within a range from about 5 Gauss to about 20 Gauss.

In some embodiments, when in an undeployed position, the deployable guard device defines a first inner region having a first area; and wherein, when in a deployed position, the deployable guard device defines a second inner region having a second area larger than the first area. In some embodiments, the deployable guard device is configured to be deployed manually from the undeployed position to the deployed position. In some embodiments, the deployable guard device is configured to be moved manually from the deployed position to the undeployed position. In some embodiments, the deployable guard device is configured to be deployed mechanically from the undeployed position to the deployed position. In some embodiments, the deployable guard device is configured to be moved mechanically from the deployed position to the undeployed position. In some embodiments, the deployable guard device is configured to be deployed pneumatically from the undeployed position to the deployed position. In some embodiments, the deployable guard device is configured to be moved pneumatically from the deployed position to the undeployed position. In some embodiments, the deployable guard device is configured to be deployed hydraulically from the undeployed position to the deployed position. In some embodiments, the deployable guard device is configured to be moved hydraulically from the deployed position to the undeployed position.

In some embodiments, the deployable guard device is substantially radially symmetrical. In some embodiments, the deployable guard device further comprises: multiple arcuate sections, including a first arcuate section, wherein: when the deployable guard device is in a deployed position, a first point on the first arcuate section is at a first distance from an isocenter of the deployable guard device, and a second point on the first arcuate second is at a second distance from the isocenter, and wherein the first and second distances are different from each other. In some embodiments, the multiple arcuate sections each comprise a first rail and a second rail slidingly engaged with the first rail. In some embodiments, the first rail comprises a slotted track configured to receive the second rail.

Some embodiments include a system comprising a portable medical imaging device; and a deployable guard device, coupled to the portable medical imaging device, the deployable guard device configured to, when deployed, inhibit encroachment within a physical boundary with respect to the portable medical imaging device.

In some embodiments, the portable medical imaging device comprises a magnetic resonance imaging (MRI) device, and the physical boundary corresponds to a volume that encompasses a region having a defined magnetic strength. In some embodiments, the deployable guard device comprises an extendible rail. In some embodiments, the extendible rail has a first diameter in an undeployed position, and a second diameter in a deployed position, and the second diameter is greater than the first diameter. In some embodiments, the extendible rail further comprises: an outer rail; and an inner rail slidingly engaged within the outer rail in a telescoping manner, such that in the undeployed position, the inner rail is substantially entirely within the outer rail, and in the deployed position, at least a portion of the inner rail is exposed. In some embodiments, the deployable guard device further comprises: a support track, configured to be secured to the portable medical imaging device; and one or more swing arms, connected at a first end thereof to the support track and connected to the outer rail at a second end thereof.

In some embodiments, the one or more swing arms are disposed substantially within the support track within the deployable guard device is in the undeployed position. In some embodiment, the second end of the one or more swing arms is extended in a radially outward direction from the support track in the deployed position. In some embodiments, the defined magnetic field strength is within a range from about 1 Gauss to about 30 Gauss. In some embodiments, wherein the defined magnetic field strength is within a range from about 5 Gauss to about 20 Gauss.

In some embodiments, when in an undeployed position, the deployable guard device defines a first inner region having a first area; and wherein, when in a deployed position, the deployable guard device defines a second inner region having a second area larger than the first area. In some embodiments, the deployable guard device is configured to be deployed manually from the undeployed position to the deployed position. In some embodiments, the deployable guard device is configured to be moved manually from the deployed position to the undeployed position. In some embodiments, the deployable guard device is configured to be deployed mechanically from the undeployed position to the deployed position. In some embodiments, the deployable guard device is configured to be moved mechanically from the deployed position to the undeployed position. In some embodiments, the deployable guard device is configured to be deployed pneumatically from the undeployed position to the deployed position. In some embodiments, the deployable guard device is configured to be moved pneumatically from the deployed position to the undeployed position. In some embodiments, the deployable guard device is configured to be deployed hydraulically from the undeployed position to the deployed position. In some embodiments, the deployable guard device is configured to be moved hydraulically from the deployed position to the undeployed position.

In some embodiments, the deployable guard device is substantially radially symmetrical. In some embodiments, the deployable guard device further comprises: multiple arcuate sections, including a first arcuate section, wherein: when the deployable guard device is in a deployed position, a first point on the first arcuate section is at a first distance from an isocenter of the deployable guard device; and a second point on the first arcuate section is at a second distance from the isocenter, and wherein the first and second distances are different from each other. In some embodiments, the multiple arcuate sections each comprise a first rail and a second rail slidingly engaged with the first rail. In some embodiments, the first rail comprises a slotted track configured to receive the second rail.

In some embodiments, the deployable guard device is coupled to the portable medical imaging device below an imaging region of the portable medical imaging device and above a base of the portable medical imaging device. In some embodiments, the base supports a magnetics system of the portable medical imaging device and houses a power system, the base comprising at least one conveyance mechanism allowing the portable medical imaging device to be transported to different locations; and the power system comprises one or more power components configured to provide power to the magnetics system to operate the portable medical imaging device to perform image acquisition. In some embodiments, the deployable guard device is couple to the portable medical imaging device above an imaging region of the portable medical imaging device. In some embodiments, the system further comprises a second deployable guard device coupled to the portable medical imaging device above the imaging region.

Some embodiments include an apparatus comprising a deployable guard device, configured to be coupled to a portable magnetic resonance imaging system, the deployable guard device further configured to, when deployed, demarcate a boundary within which a magnetic field strength of a magnetic field generated by the portable magnetic resonance imaging system equals or exceeds a given threshold.

Some embodiments include a deployable guard device, comprising: an inner portion configured to be coupled to a portable magnetic resonance imaging device; a plurality of swing arms movably coupled to the inner portion; and an outer portion movable coupled to the plurality of swing arms.

In some embodiments, the inner portion is substantially circular. In some embodiments, the outer portion is substantially circular. In some embodiments, the outer portion comprises multiple arcuate sections including a first arcuate section, wherein: when the deployable guard device is in a deployed position, a first point on the first arcuate section is at a first distance from an isocenter of the deployable guard device, and a second point on the first arcuate section is at a second distance from the isocenter, and wherein the first and second distances are different from each other. In some embodiments, when in an undeployed position, the deployable guard device defines a first inner region having a first area; and wherein, when in a deployed position, the deployable guard device defines a second inner region having a second area larger than the first area.

In some embodiments, the deployable guard device is configured to be deployed manually from the undeployed position to the deployed position. In some embodiments, the deployable guard device is configured to be moved manually from the deployed position to the undeployed position. In some embodiments, the deployable guard device is configured to be deployed mechanically from the undeployed position to the deployed position. In some embodiments, the deployable guard device is configured to be moved mechanically from the deployed position to the undeployed position. In some embodiments, the deployable guard device is configured to be deployed pneumatically from the undeployed position to the deployed position. In some embodiments, the deployable guard device is configured to be moved pneumatically from the deployed position to the undeployed position. In some embodiments, the deployable guard device is configured to be deployed hydraulically from the undeployed position to the deployed position. In some embodiments, the deployable guard device is configured to be moved hydraulically from the deployed position to the undeployed position.

In some embodiments, the plurality of swing arms comprises at least four swing arms. In some embodiments, the outer portion further comprises: an outer rail; and an inner rail slidingly engaged with the outer rail in a telescoping manner, such that in an undeployed position, the inner rail is disposed substantially entirely within the outer rail, and, in a deployed position, at least a portion of the inner rail is exposed. In some embodiments, the inner portion is configured to be coupled to a base of the portable magnetic resonance imaging device, wherein: the base supports a magnetics system of the portable magnetic resonance imaging device and houses a power system, the base comprising at least one conveyance mechanism allowing the portable medical imaging device to be transported to different locations; and the power system comprises one or more power components configured to provide power to the magnetics system to operate the portable medical imaging device to perform image acquisition. In some embodiments, the inner portion is configured to be coupled to the portable magnetic resonance imaging device through a plurality of mounting tabs. In some embodiments, the plurality of mounting tabs comprises four or more mounting tabs.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 1 is an exemplary portable medical imaging device for use in accordance with some embodiments of the technology described herein.

FIGS. 13A-E illustrate views of a deployable guard device having a "clover" design, including views of the guard in deployed and undeployed configurations, in accordance with some embodiments of the technology described herein.

FIGS. 14A-D illustrate views of a support track of a deployable guard device having a "clover" design, in accordance with some embodiments of the technology described herein.

FIGS. 16A-C illustrate views of a swing arm of a deployable guard device having a "clover" design, in accordance with some embodiments of the technology described herein.

FIG. 18A-C illustrate views of another rail portion of the deployable guard device having a "clover" design, in accordance with some embodiments of the technology described herein.

FIGS. 19A-F illustrate views of a deployable guard device having a "hoop" design, in accordance with some embodiments of the technology described herein.

FIGS. 21A-E illustrate views of a mounting tab of a deployable guard device having a "hoop" design, in accordance with some embodiments of the technology described herein.

FIGS. 22A-C illustrate views of a swing arm of a deployable guard device having a "hoop" design, in accordance with some embodiments of the technology described herein.

FIGS. 23A-H illustrate views of a hinge having ball detents of a support track of a deployable guard device having a "hoop" design, in accordance with some embodiments of the technology described herein.

DETAILED DESCRIPTION

Figure 2A:
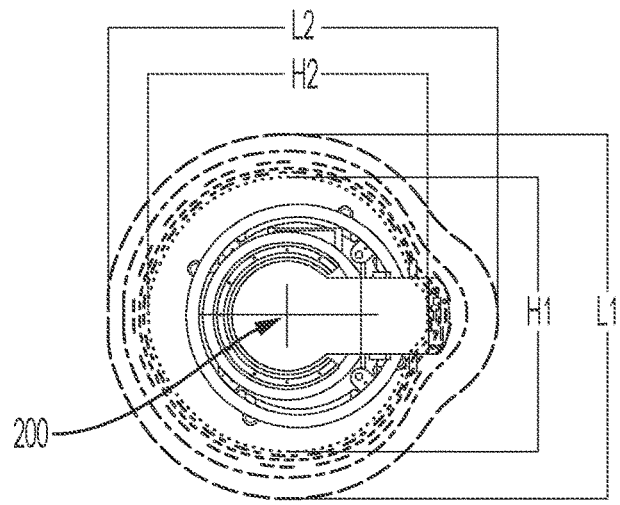
FIGS. 2A, 2B and 2C are top, front and side views of a portable medical imaging device, for example of the portable medical imaging device shown in FIG. 1, illustrating example magnetic fringe fields associated with the device.

The MRI scanner market is overwhelmingly dominated by high-field systems, and is exclusively so for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 milliTesla (mT) are referred to herein as "ultra-low field".

The appeal of high-field MRI systems include improved resolution and/or reduced scan times compared to lower field systems, motivating the push for higher and higher field strengths for clinical and medical MRI applications. However, as also discussed above, increasing the field strength of MRI systems yields increasingly more expensive and complex MRI scanners, thus limiting availability and preventing their use as a general purpose and/or generally available imaging solution.

Low-field MRI has been explored in limited contexts for non-imaging research purposes and narrow and specific contrast-enhanced imaging applications, but is conventionally regarded as being unsuitable for producing clinically useful images. For example, the resolution, contrast, and/or image acquisition time is generally not regarded as being suitable for clinical purposes such as, but not limited to, tissue differentiation, blood flow or perfusion imaging, diffusion-weighted (DW) or diffusion tensor (DT) imaging, functional MRI (fMRI), etc.

More recently, certain advancements (such as those developed by the assignee of the instant application) have paved the way for improved quality, portable and/or lower-cost low-field MRI systems that can, in turn, drive wide-scale deployability of MRI technology in a variety of environments beyond the large MRI installments at hospitals and research facilities. As such, low-field MRI presents an attractive imaging solution, providing a relatively low cost, high availability alternative to high-field MRI. In particular, low-field MRI systems can be implemented as self-contained systems that are deployable in a wide variety of clinical settings where high-field MRI systems cannot, for example, by virtue of being transportable, cartable or otherwise generally mobile so as to be deployable where needed. As a result of this portability, such low-field MRI systems may be expected to operate in generally unshielded or partially shielded environments (e.g., outside of specially shielded rooms or encompassing cages) while also handling the particular noise environment in which they are deployed.

The inventors have recognized that with the emergence of a new paradigm for MRI, certain additional challenges may arise with respect to a portable, point-of-care (POC) MRI system that can be installed in a variety of settings such as an emergency room, office or clinic. For example, when in storage or when transported from location to location, a portable, low-field POC MRI system (including any of the systems described herein) may temporarily reside in (or pass through) an area or areas that are not access controlled. On the one hand, a low-field system MRI system operates at a static magnetic field much lower than that of conventional high-field MRI systems, and as such certain risks typically associated with high-field systems (e.g., potential projectile effects) are likely absent. On the other hand, there still may be other concerns associated with having even low-level static magnetic fields present in areas that are not access controlled. Examples of such concerns may include, but are not necessarily limited to: individuals having active implants (e.g., pacemakers, defibrillators, insulin pumps, deep brain stimulators, vagus nerve stimulators, cochlear implants, etc.) in the vicinity of the MRI system; individuals with metal containing tattoos or permanent make-up on the head or neck regions in the vicinity of the MRI system; and individuals with suspected metal present in the eye (e.g., metal workers, injury victim, etc.) in the vicinity of the MRI system.

High fringe fields may be dangerous to bystanders for the reasons discussed herein, however low-strength fringe fields (e.g., fringe fields having a strength of less than 30 Gauss, less than 25 Gauss, less than 20 Gauss, less than 15 Gauss, less than 10 Gauss, less than 5 Gauss, less than 2 Gauss, less than 1 Gauss, any strength in the range of 2-10 Gauss or 2-20 Gauss, etc.) may be tolerated because such low-strength fringe fields may not present a safety concern or otherwise interfere with operation of nearby electronics including implants (e.g., pacemakers) or other electronic devices (e.g., medical instruments, smartphones, etc.).

In some environments, safety regulations may require indications of the boundary or perimeter within which the magnetic field of the MRI system exceeds a given threshold field strength. These boundaries are sometimes called "Gauss lines." A Gauss line for a device may indicate a region, outside of which, the strength of a magnetic field generated by the device is less than a threshold strength. For example, the 5 Gauss line for an MRI device may indicate a region outside of which the magnetic field generated by the MRI device has a strength of less than 5 Gauss. Magnetic fields having strength higher than 30 Gauss may present projectile hazards. Some safety regulations may require the 5, 10 and 200 Gauss lines to be indicated to demarcate the physical perimeters within which the respective thresholds are exceeded.

It should be appreciated that such challenges are generally not of concern with respect to the more conventional, high field MRI systems that are typically immobile and installed in specialized rooms with extensive shielding and defined access control protocols. For example, compliance with the above-mentioned safety regulations may be achieved by indicating the 5, 10 and 200 Gauss lines on the floor of the room in which the MRI system is installed, to remind personnel where the respective protocols need to be enforced. This solution is generally inapplicable in the context of portable MRI systems because the perimeters requiring demarcation would need to move along with the MRI device. In view of this and as described herein, embodiments of the disclosure provide for a deployable guard device, configured to be coupled to a portable medical imaging device. When deployed, the deployable guard device is configured to inhibit encroachment within a physical boundary with respect to the portable medical imaging device.

Figure 6:
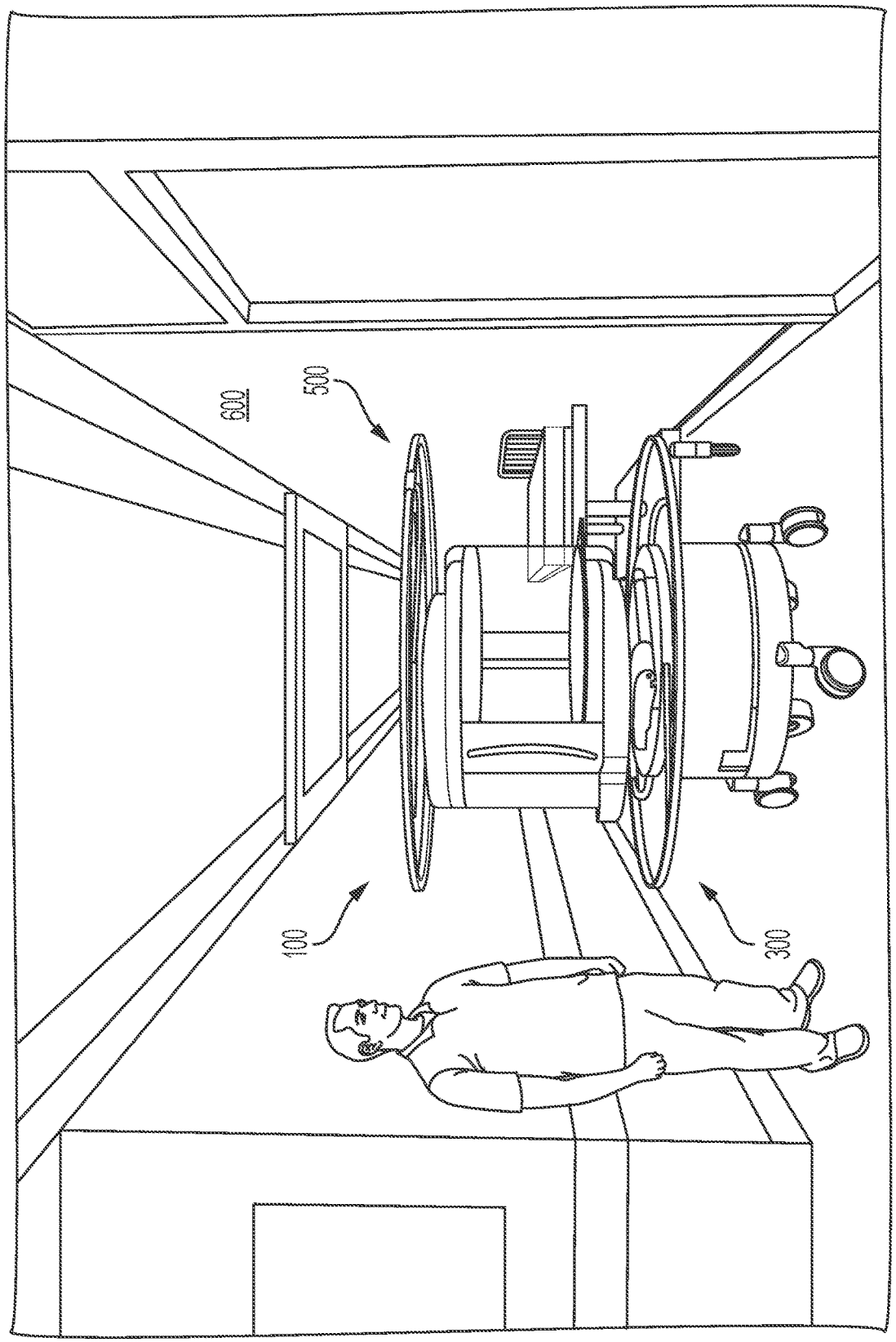
FIG. 6 illustrates a first exemplary environment for a portable medical imaging device configured with one or more deployable guard devices, in accordance with some embodiments of the technology described herein.

The inventors have recognized that the inclusion of a deployable guard coupled to the portable medical imaging device is particularly important in embodiments in which the portable medical imaging device includes one or more permanent magnets. Unlike other magnetic assemblies, a magnetics component comprising a permanent magnet produces fringe fields both during operation of the medical imaging device and during transport and storage of the medical imaging device when the portable medical imaging device is otherwise not being operated. As described herein, transport and storage of the portable medical imaging device may involve the device entering uncontrolled areas where bystanders may be present, such as a hallway as illustrated in FIG. 6. Thus, when a portable medical imaging device includes one or more permanent magnets (e.g., to generate the $B_0$ field), it is important to provide a physical boundary demarcating the region in which it is unsafe for bystanders or electronic devices to enter due to fringe fields produced during operation, transport, and storage of the portable medical imaging device.

In some embodiments, the deployable guard device may be configured to provide a physical boundary corresponding to a particular Gauss line. For example, in some embodiments, the deployable guard device, when in a deployed position, may provide a physical barrier to encroachment such that the region within the physical barrier includes a particular Gauss line (e.g., the 5 Gauss line, the 10 Gauss line, etc.). To this end, the deployable guard device may be configured such that, when deployed, the outer perimeter of the deployable guard device extends beyond the particular Gauss line relative to the portable MR system to which the deployable guard device is coupled.

For ease of explanation, embodiments of a deployable guard device disclosed herein are described in the context of a portable POC MRI system; however, it should be appreciated that such a guard device may also be used in conjunction with other devices including, but not limited to, X-ray images, CT imaging devices, etc.

Referring initially to FIG. 1, there is shown an exemplary portable medical imaging device 100 (also referred to herein as a portable MRI system) for use in accordance with embodiments of the technology described herein. In the embodiment depicted in FIG. 1, the portable medical imaging device 100 may be a POC MRI system including a $B_0$ magnet 104 having at least one first permanent magnet 106a and at least one second permanent magnet 106b magnetically coupled to one another by a ferromagnetic yoke 108 configured to capture and channel magnetic flux to increase the magnetic flux density within the imaging region (field of view) of the MRI system 100. Alternatively, in some embodiments, $B_0$ magnet 104 may be formed using electromagnets, laminate magnets, or hybrid magnets. Additional information regarding the formation of $B_0$ magnet 104 may be found in U.S. Patent Publication No. US 2018/0143274, filed Nov. 22, 2017 and titled "Low-Field Magnetic Resonance Imaging Methods and Apparatus", hereby incorporated by reference.

In some embodiments, the $B_0$ magnet 104 may be coupled to or otherwise attached or mounted to a base 110 by a positioning mechanism 112 (such as for example a goniometric stage) so that the $B_0$ magnet can be tilted (e.g., rotated about its center of mass) to provide an incline to accommodate a patient's anatomy as needed. In addition to providing a load bearing structure(s) for supporting the $B_0$ magnet 104, the base 110 may also include an interior space or compartment(s) configured to house the electronics (not shown) used to operate the portable MRI system 100. For example, the base 110 may house power components to operate gradient coils (e.g., X, Y and Z) and RF transmit/receive coils, as well as RF coil amplifiers (power amplifiers to operate the transmit/receive coils of the system), power supplies, console, power distribution unit and other electronics needed to operate the MRI system.

In some embodiments, the electronics needed to operate portable MRI system 100 may consume less than 1 kW of power and, in some embodiments, less than 750 W of power (e.g., MRI systems utilizing a permanent $B_0$ magnet solution). However, systems that consume greater power may also be utilized as well, as the aspects of the technology described herein are not limited in this respect. As such, the exemplary portable MRI system 100 may be powered via a single power connection 114 configured to connect to a source of mains electricity, such as an outlet providing single-phase power (e.g., a standard or large appliance outlet). Accordingly, the portable MRI system 100 can be plugged into a single available power outlet and operated therefrom. Aspects of power systems that may be used as part of portable MRI system 100 are described in U.S. Patent Publication No. US 2018/0143274, filed Nov. 22, 2017 and titled "Low-Field Magnetic Resonance Imaging Methods and Apparatus", which is incorporated by reference in its entirety.

As further illustrated in FIG. 1, the portable MRI system 100 may also include a conveyance mechanism 116 that allows the portable MRI system 100 to be transported to different locations. The conveyance mechanism 116 may include one or more components configured to facilitate movement of the portable MRI system 100, for example, to a location at which MRI is needed. According to some embodiments, conveyance mechanism 116 may include a motor 118 coupled to drive wheels 120. In this manner, the conveyance mechanism 116 provides motorized assistance in transporting the MRI system 100 to desired locations. Additionally, the conveyance mechanism 116 may also include a plurality of casters 122 to assist with support and stability as well as facilitating transport.

In some embodiments, the conveyance mechanism 116 may optionally include motorized assistance controlled via a joystick (not shown) to guide the portable MRI system 100 during transportation to desired locations. According to some embodiments, the conveyance mechanism 116 may also include a power assist mechanism configured to detect when force is applied to the MRI system and, in response, to engage the conveyance mechanism 116 to provide motorized assistance in the direction of the detected force. For example, handles 124 may be configured to detect when force is applied thereto the rail (e.g., by personnel pushing on the handles 124) and engage the conveyance mechanism 116 to provide motorized assistance to drive the wheels 120 in the direction of the applied force. As a result, a user can guide the portable MRI system 100 with the assistance of the conveyance mechanism 116 that responds to the direction of force applied by the user.

Figures 2B, 2C:
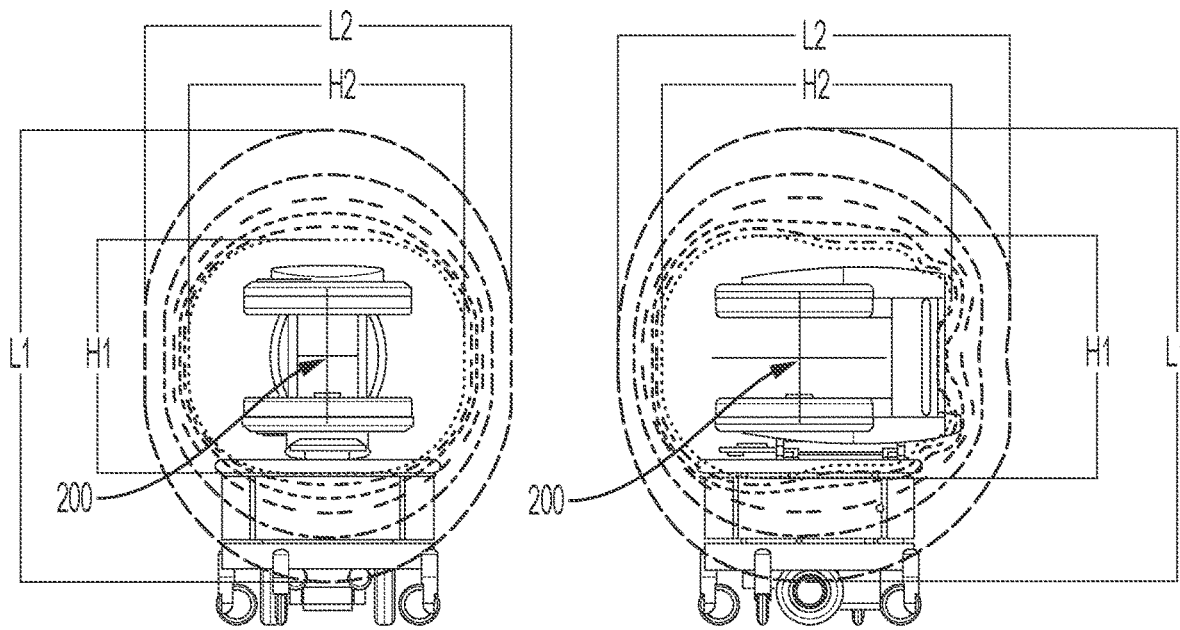

As indicated above, although the portable MRI system 100 operates at a $B_0$ field strength well below that of a traditional high-field system, there still may be concerns with access control, given certain fringe field strengths around an isocenter 200 of the $B_0$ magnet 104. By way of illustration, FIGS. 2A, 2B and 2C are top, front and side views, respectively, of a portable medical imaging device, for example, the device shown in FIG. 1. For example, an innermost region (defined by dimensions H1 and H2) may represent a 30 Gauss region and an outermost region (defined by dimensions L1 and L2) may represent a 5 Gauss region, wherein the fringe field strength decreases with increasing distance from the isocenter 200. Thus, one consideration in this regard may be, for example, the International Electrotechnical Commission (IEC) 60601-2-33 standard, which defines controlled access as an area to which access is controlled for safety reasons. The standard further specifies that a controlled access area around the MR equipment shall be defined such that outside this area: 1) the magnetic fringe field strength shall not exceed 0.5 mT and 2) the electromagnetic interference level complies with IEC 60601-1-2.

Figure 3A:
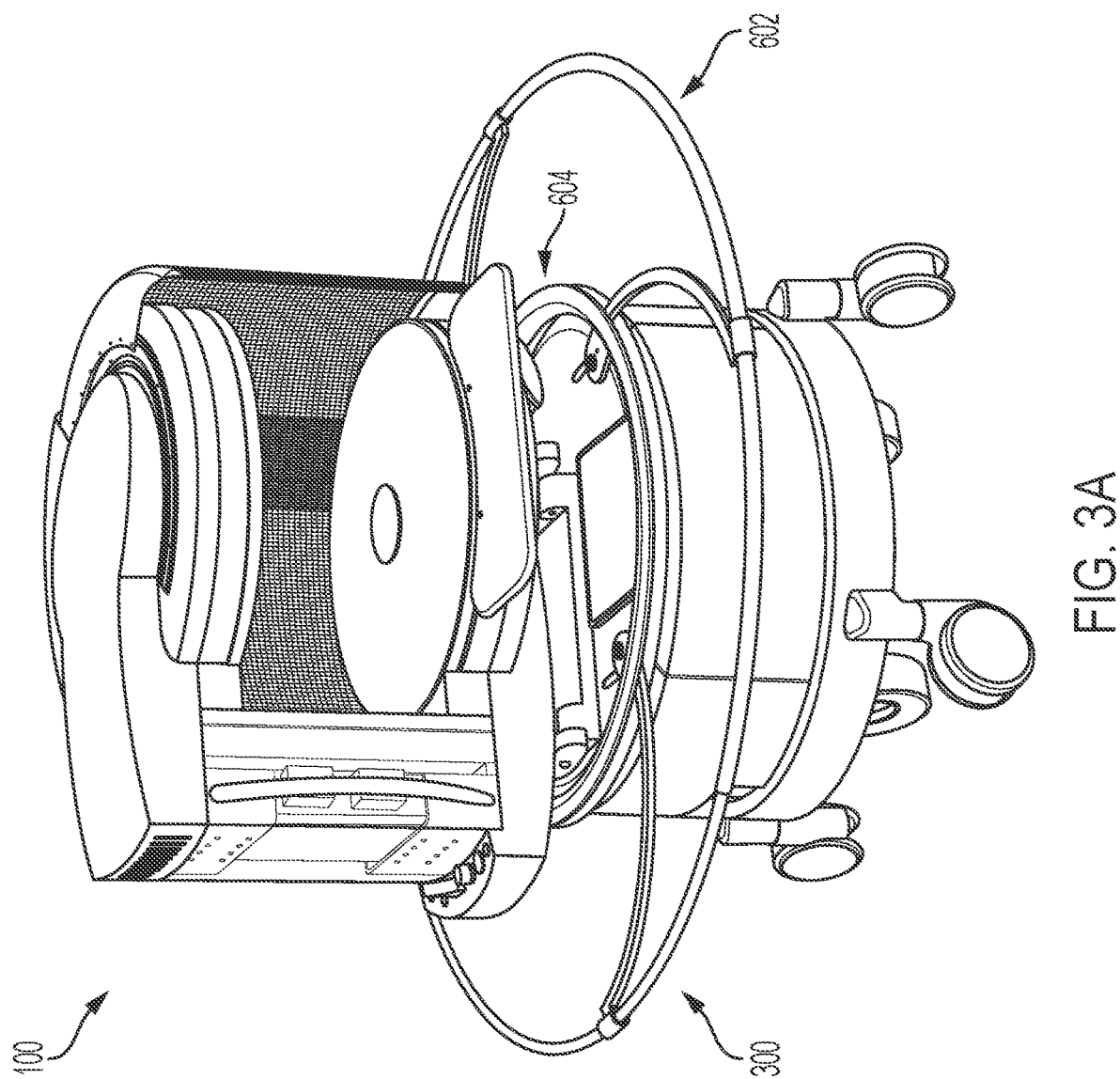
FIG. 3A illustrates the portable medical imaging device of FIG. 1 with a deployable guard device having a "hoop" design, shown in a deployed position, and coupled to the portable medical imaging device below its $B_0$ magnet, in accordance with some embodiments of the technology described herein.

Accordingly, FIG. 3A illustrates the portable medical imaging device 100 of FIG. 1 with a deployable guard device 300 having a "hoop" design, shown in a deployed position, and coupled to the portable medical imaging device below its $B_0$ magnet, in accordance with some embodiments of the technology described herein. The deployable guard device 300 in FIG. 3A is illustrated having a "hoop" design. In the illustrated embodiment, the deployable guard device 300 includes a support track 904, one or more swing arms 910, one or more hollow collars 912, an inner rail 908, an outer rail 902, and one or more Velcro straps 904, as described herein including with reference to FIGS. 9-10. As shown in FIG. 3A, the device 300 has a substantially radially symmetric design. For example, the diameter of an inner region defined by the deployable guard device 300 having the "hoop" design may be substantially equal at all points along the deployable guard device 300 having the "hoop" design when the device 300 is in the deployed position or the undeployed position, respectively. Aspects of the deployable guard device 300 are described herein including with reference to FIGS. 9-12, FIGS. 19-24.

In some embodiments, the support track 904 of the deployable guard device 300 having the "hoop" design may be formed from a material such as stainless steel. In some embodiments, outer rail 902 and inner rail 908 may be formed from PVC, plastic, or other suitable material(s). For example, the outer rail 904 and inner rail 902 may be formed from polyethylene. In some embodiments, the one or more swing arms 910 and one or more hollow collars 912 may be formed from aluminum or other suitable material(s). In some embodiments, the one or more swing arms 910, one or more hollow collars 912, support track 904, outer rail 902 and inner rail 908 may all be formed from a plastic material, such as polyethylene, for example.

In the illustrated embodiment, the deployable guard device 300 is coupled to the portable medical imaging device 100. The deployable guard device 300 may be coupled to the portable medical imaging device in any suitable way including by way of example: (1) below the $B_0$ magnet 104 and above the base 110 of the portable medical imaging device 100 (e.g., as shown in FIG. 3A); (2) below the first permanent magnet 106a and above the second permanent magnet 106b; (3) or above the first permanent magnet 106a. The base 110 may provide a load bearing structure(s) for supporting the $B_0$ magnet 104 and may also include an interior space or compartment(s) configured to house electronics used to operate the portable medical imaging device 100.

The deployable guard device 300 in FIG. 3A is illustrated in a deployed position. When the deployable guard device 300 is in the undeployed position, the device 300 defines a first inner region 210A illustrated in FIG. 9, having a first area. When the deployable guard device 300 is in the deployed position, the device 300 defines a second inner region 210B illustrated in FIG. 10, having a second area larger than the first area. Therefore, the area of the inner region defined by the deployable guard device 300 is increased when the deployable guard device 300 is transitioned from the undeployed position to the deployed position.

Figure 3B:
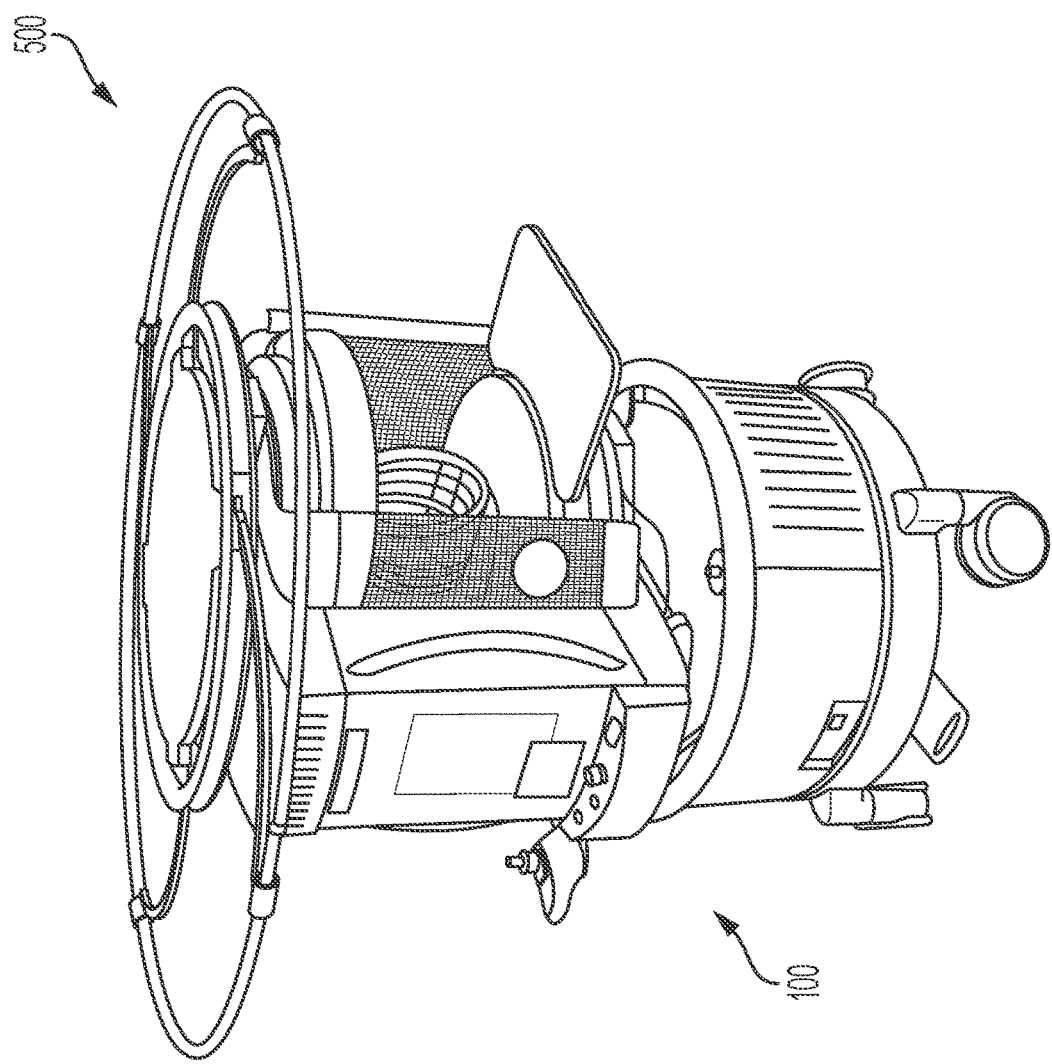
FIG. 3B illustrates the portable medical imaging device of FIG. 1 with a deployable guard device having a "hoop" design, shown in a deployed position, and coupled to the portable medical imaging device above its $B_0$ magnet, in accordance with some embodiments of the technology described herein.

FIG. 3B illustrates the portable medical imaging device 100 of FIG. 1 with a second deployable guard device 500 having a "hoop" design shown in a deployed position, and coupled to the portable medical imaging device 100 above its $B_0$ magnet, in accordance with some embodiments of the technology described herein. The second deployable guard device 500 illustrated in FIG. 3B is configured having the "hoop" design described herein. Aspects of the second deployable guard device 500 are described herein including with reference to FIGS. 9-12, FIGS. 19-24.

In the illustrated embodiment, the second deployable guard device 500 is coupled to the portable medical imaging device 100. The second deployable guard device 500 may be coupled to the portable medical imaging device, for example, below the $B_0$ magnet 104 and above the base 110 of the portable medical imaging device 100, below the first permanent magnet 106a and above the second permanent magnet 106b, or above the first permanent magnet 106a (e.g., as shown in FIG. 3B), as the embodiments of the technology disclosed herein are not limited in this respect.

Figure 3C:
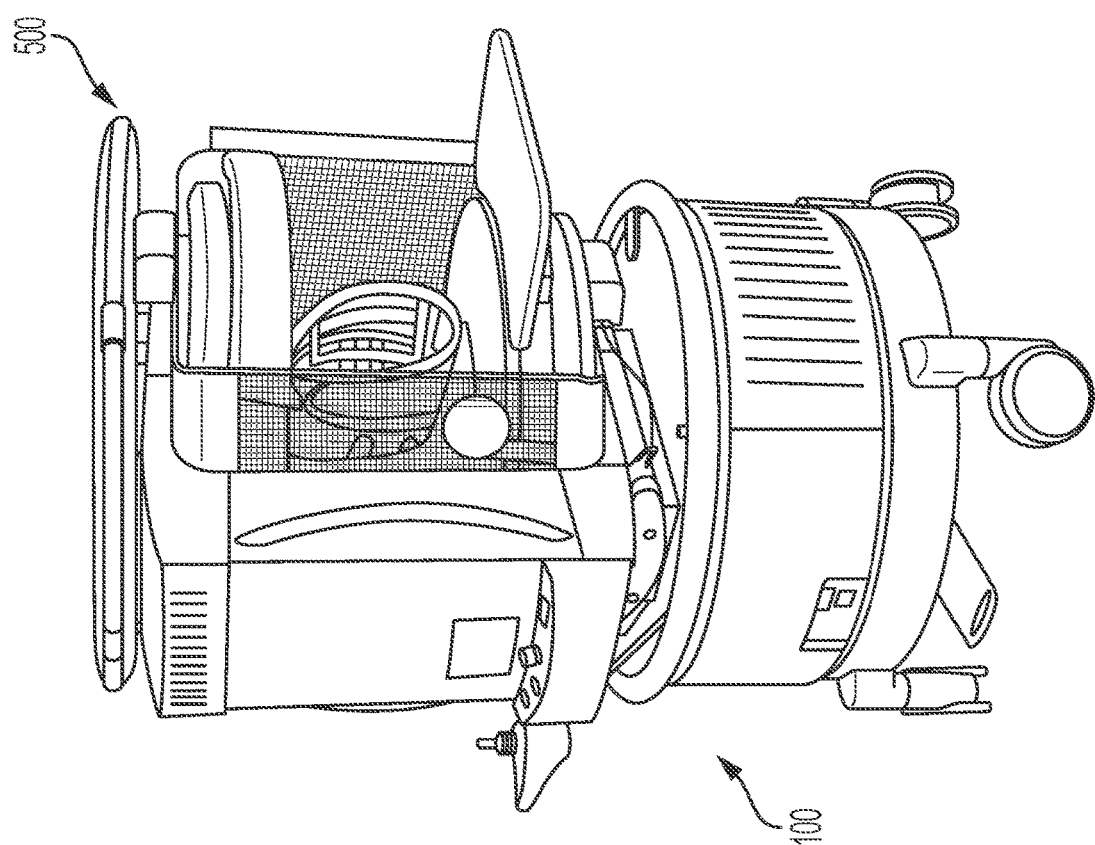
FIG. 3C illustrates the portable medical imaging device of FIG. 1 with a deployable guard device having a "hoop" design, shown in an undeployed position, and coupled to the portable medical imaging device above its $B_0$ magnet, in accordance with some embodiments of the technology described herein.

The second deployable guard device 500 in FIG. 3B is illustrated in a deployed position, although the second deployable guard device 500 may be configured in an undeployed position in addition to the deployed position as is illustrated in FIG. 3C. When the second deployable guard device 500 is in the undeployed position, the device 500 defines a first inner region 210A illustrated in FIG. 9, having a first area. When the second deployable guard device 500 is in the deployed position, the device 500 defines a second inner region 210B illustrated in FIG. 10, having a second area larger than the first area. Therefore, the area of the inner region defined by the second deployable guard device 500 is increased when the second deployable guard device 500 is transitioned from the undeployed position to the deployed position.

FIG. 3C illustrates the portable medical imaging device 100 of FIG. 1 with a deployable guard device 500 having a "hoop design", shown in an undeployed position, and coupled to the portable medical imaging device 100 above its $B_0$ magnet, in accordance with some embodiments of the technology described herein. The second deployable guard device 500 illustrated in FIG. 3C is configured having the "hoop" design described herein. Aspects of the second deployable guard device 500 are described herein including with reference to FIGS. 9-12, FIGS. 19-24.

In the illustrated embodiment, the second deployable guard device 500 is coupled to the portable medical imaging device 100. The second deployable guard device 500 may be coupled to the portable medical imaging device, for example, below the $B_0$ magnet 104 and above the base 110 of the portable medical imaging device 100, below the first permanent magnet 106a and above the second permanent magnet 106b, or above the first permanent magnet 106a (e.g., as shown in FIG. 3C), as the embodiments of the technology disclosed herein are not limited in this respect.

The second deployable guard device 500 in FIG. 3C is illustrated in an undeployed position, although the second deployable guard device 500 may be configured in a deployed position in addition to the deployed position as is illustrated in FIG. 3B. When the second deployable guard device 500 is in the undeployed position, the device 500 defines a first inner region 210A illustrated in FIG. 9, having a first area. When the second deployable guard device 500 is in the deployed position, the device 500 defines a second inner region 210B illustrated in FIG. 10, having a second area larger than the first area. Therefore, the area of the inner region defined by the second deployable guard device 500 is increased when the second deployable guard device 500 is transitioned from the undeployed position to the deployed position.

Figure 3D:
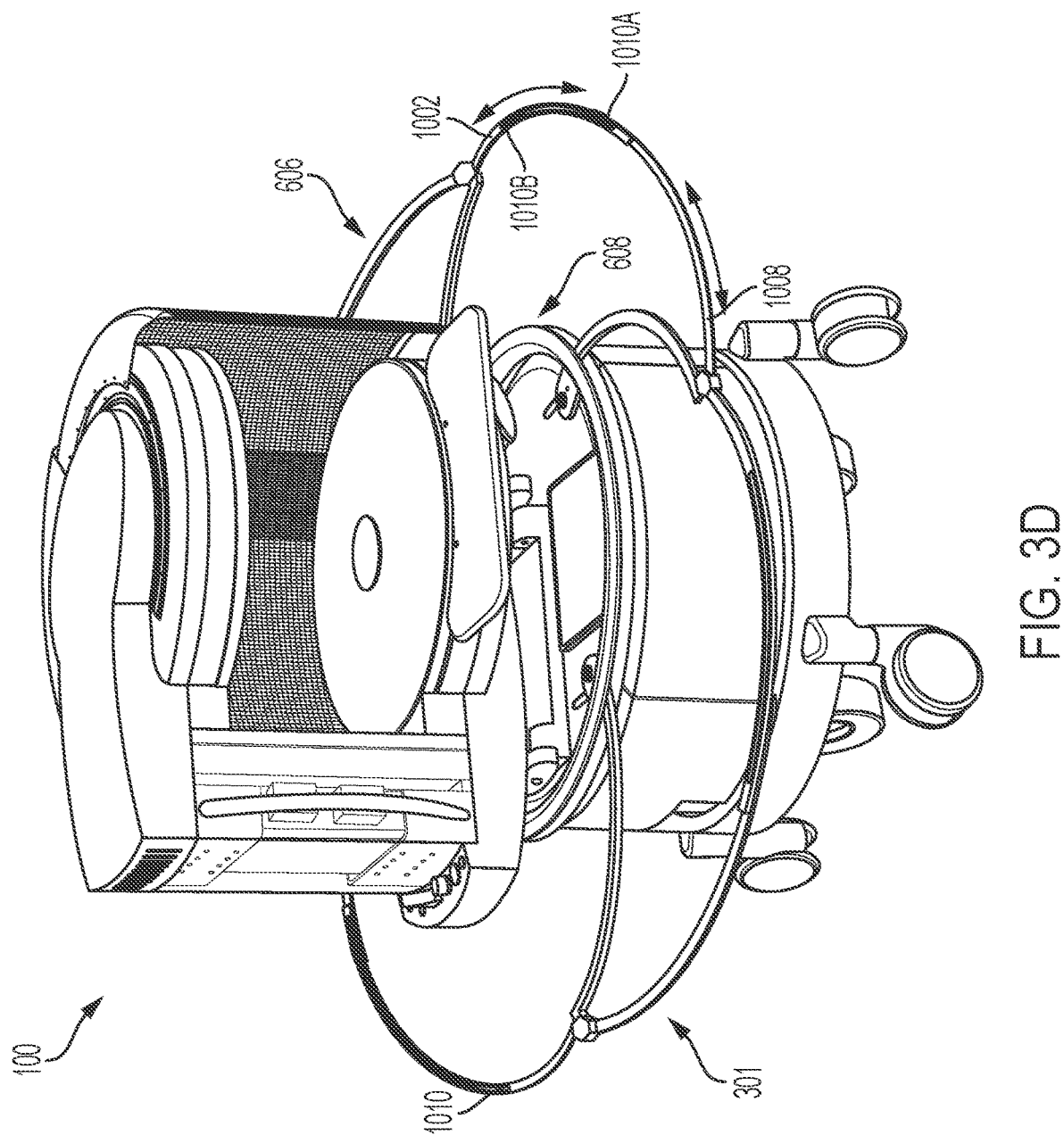
FIG. 3D illustrates the portable medical imaging device of FIG. 1 with a deployable guard device having a "clover" design, shown in a deployed position, and coupled to the portable medical imaging device below its $B_0$ magnet, in accordance with some embodiments of the technology described herein.

FIG. 3D illustrates the portable medical imaging device 100 of FIG. 1 with a deployable guard device 301 having a "clover" design, shown in a deployed position, and coupled to the portable medical imaging device below its $B_0$ magnet, in accordance with some embodiments of the technology described herein. The deployable guard device 301 in FIG. 3D is illustrated having a "clover" design. The "clover" design may comprise a support track 904, one or more swing arms 910, one or more first rail portions 1008, and one or more second rail portions 1002 each having a slotted track 1010, as described herein. The "clover" design may comprise one or more arcuate sections 1012A-D, each of the arcuate sections 1012A-D may be substantially symmetrical with respect to each other. When the deployable guard device 301 having the "clover" design is in the undeployed position, the diameter of a first inner region 210C illustrated in FIG. 13D, defined by the deployable guard device 301 having the "clover" design may be substantially equal at all points along the deployable guard device 301. When the deployable guard device 301 having the "clover" design is in the undeployed position, the diameter of a second inner region 210D illustrated in FIG. 13A, defined by the deployable guard device 301 having the "clover" design may vary at points along the first and second rail portions 1008, 1002 of the deployable guard device. Aspects of the deployable guard device 301 are described herein including with reference to FIGS. 13-18.

The support track 904 of the deployable guard device 301 having the "clover" design may be formed from a material such as stainless steel. First and second rail portions 1008, 1002 and the one or more swing arms 910 may be formed from aluminum or other suitable material(s). In some embodiments, the one or more swing arms 910, support track 904, first rail portion 1008 and second rail portion 1002 may all be formed from a plastic material, such as polyethylene, for example.

In the illustrated embodiment, the deployable guard device 301 is coupled to the portable medical imaging device 100. The deployable guard device 301 may be coupled to the portable medical imaging device, for example, below the $B_0$ magnet 104 and above the base 110 of the portable medical imaging device 100 (e.g., as shown in FIG. 3D), below the first permanent magnet 106a and above the second permanent magnet 106b, or above the first permanent magnet 106a, as the embodiments of the technology disclosed herein are not limited in this respect. The base 110 may provide a load bearing structure(s) for supporting the $B_0$ magnet 104 and may also include an interior space or compartment(s) configured to house electronics used to operate the portable medical imaging device 100.

The deployable guard device 301 in FIG. 3D is illustrated in a deployed position, although the deployable guard device 301 may be configured in an undeployed position in addition to the deployed position. When the deployable guard device 301 is in the undeployed position, the device 301 defines a first inner region 210C illustrated in FIG. 13D, having a first area. When the deployable guard device 301 is in the deployed position, the device 301 defines a second inner region 210D illustrated in FIG. 13A, having a second area larger than the first area. Therefore, the area of the inner region defined by the deployable guard device 301 is increased when the deployable guard device 301 is transitioned from the undeployed position to the deployed position.

Figure 3E:
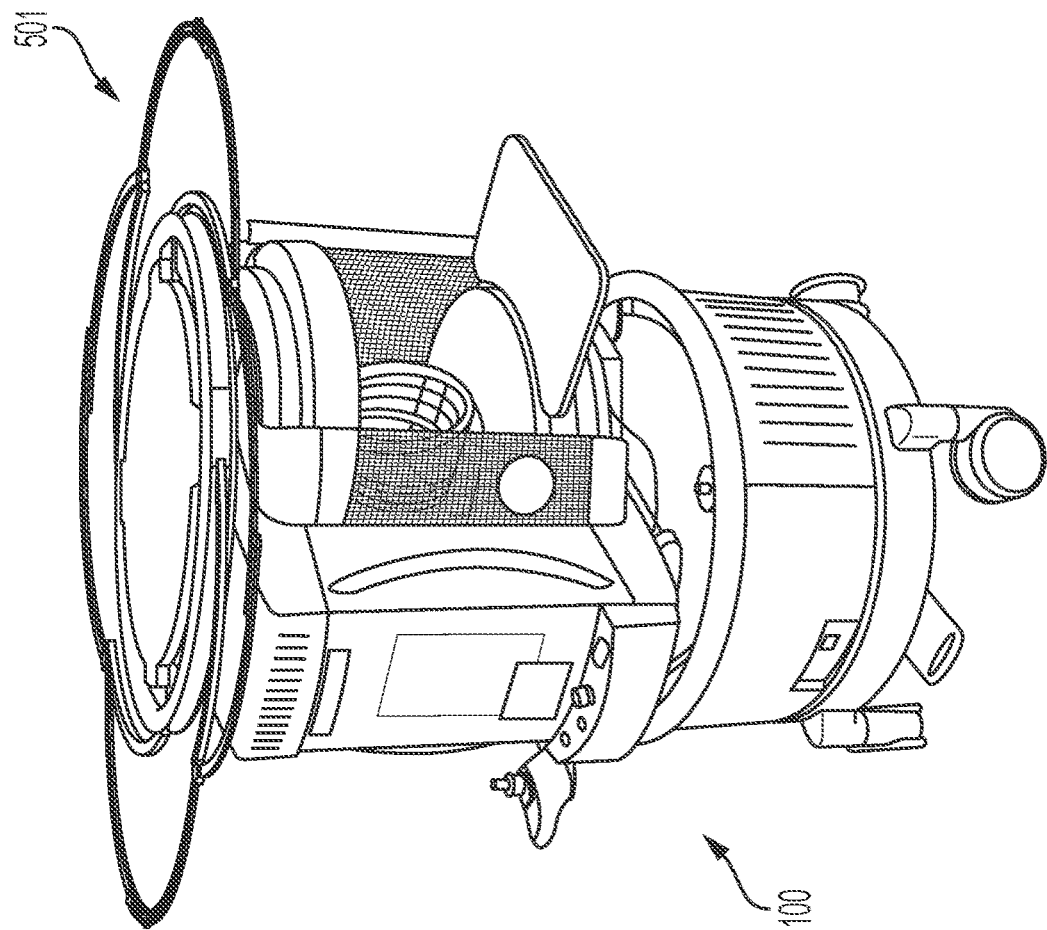
FIG. 3E illustrates the portable medical imaging device of FIG. 1 with a deployable guard device having a "clover" design, shown in a deployed position, and coupled to the portable medical imaging device above its $B_0$ magnet, in accordance with some embodiments of the technology described herein.

FIG. 3E illustrates the portable medical imaging device 100 of FIG. 1 with a deployable guard device 501 having a "clover" design, shown in a deployed position, and coupled to the portable medical imaging device above its $B_0$ magnet, in accordance with some embodiments of the technology described herein. The second deployable guard device 501 in FIG. 3E is illustrated having a "clover" design. Aspects of the second deployable guard device 501 are described herein including with reference to FIGS. 13-18.

In the illustrated embodiment, the second deployable guard device 501 is coupled to the portable medical imaging device 100. The second deployable guard device 501 may be coupled to the portable medical imaging device, for example, below the $B_0$ magnet 104 and above the base 110 of the portable medical imaging device 100, below the first permanent magnet 106a and above the second permanent magnet 106b, or above the first permanent magnet 106a (e.g., as shown in FIG. 3E), as the embodiments of the technology disclosed herein are not limited in this respect.

The second deployable guard device 501 in FIG. 3E is illustrated in a deployed position, although the second deployable guard device 501 may be configured in an undeployed position in addition to the deployed position. When the second deployable guard device 501 is in the undeployed position, the device 501 defines a first inner region 210C illustrated in FIG. 13D, having a first area. When the second deployable guard device 501 is in the deployed position, the device 501 defines a second inner region 210D illustrated in FIG. 13A, having a second area larger than the first area. Therefore, the area of the inner region defined by the second deployable guard device 501 is increased when the second deployable guard device 501 is transitioned from the undeployed position to the deployed position.

Figure 4:
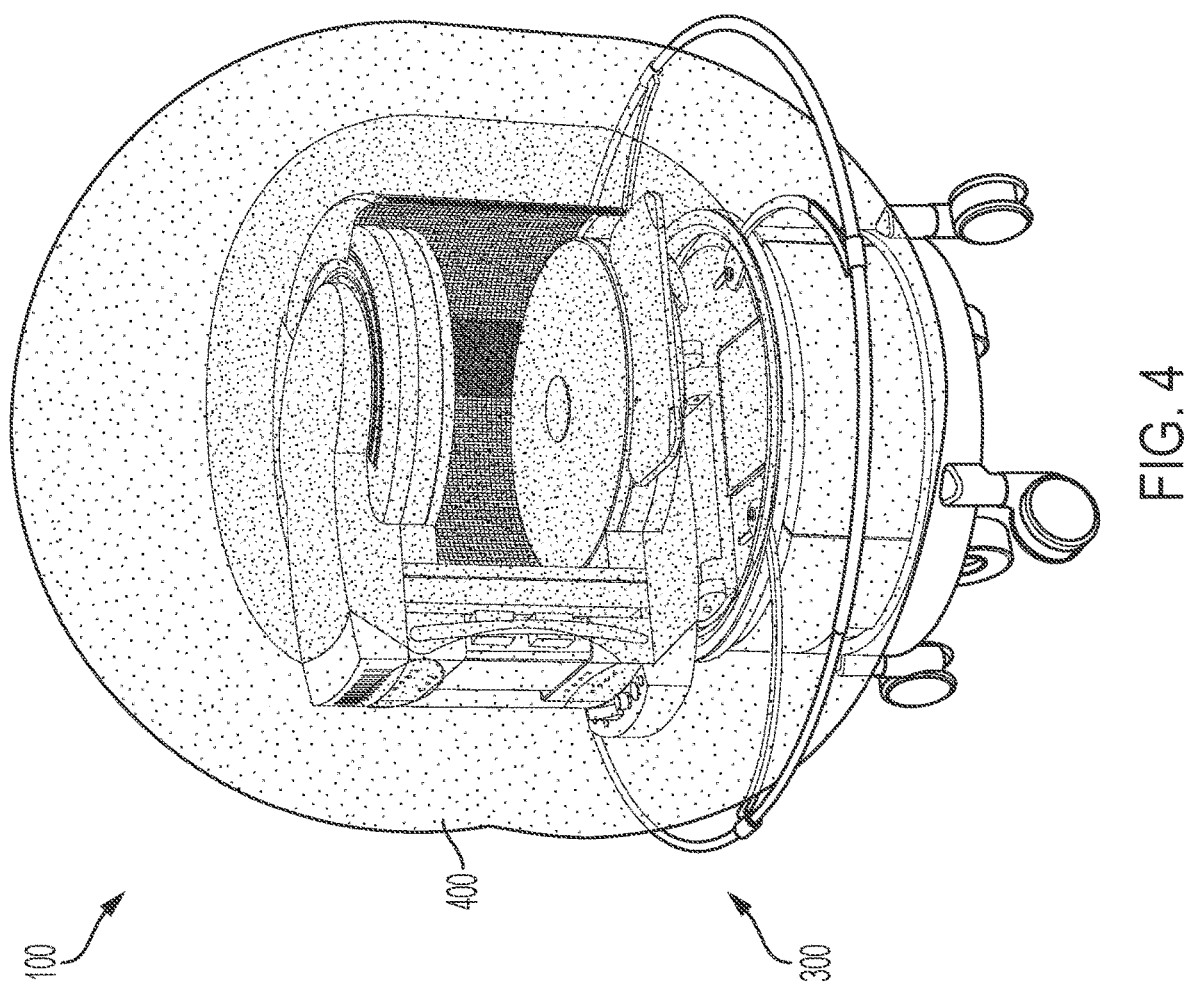
FIG. 4 illustrates the portable medical imaging device configured with the hoop-shaped deployable guard device of FIG. 3A, particularly illustrating a physical boundary in relationship to the guard, in accordance with some embodiments of the technology described herein.

As described in further detail herein, when the deployable guard device according to embodiments of the technology described herein is deployed, it serves as a physical barrier to inhibit encroachment within a defined region having a certain magnetic field strength. In one specific example, a defined region 400 is illustrated in FIG. 4. As can be seen, when the deployable guard device 300 is in the deployed position, the device 300 extends beyond the region 400 (e.g., 1 Gauss, G gauss, 10 Gauss, 20 Gauss, etc.) such that the guard device 300 is capable of inhibiting physical encroachment within this region. Therefore, the guard device according to the embodiments described herein is capable of demarcating any strength Gauss line as desired.

Figure 5:
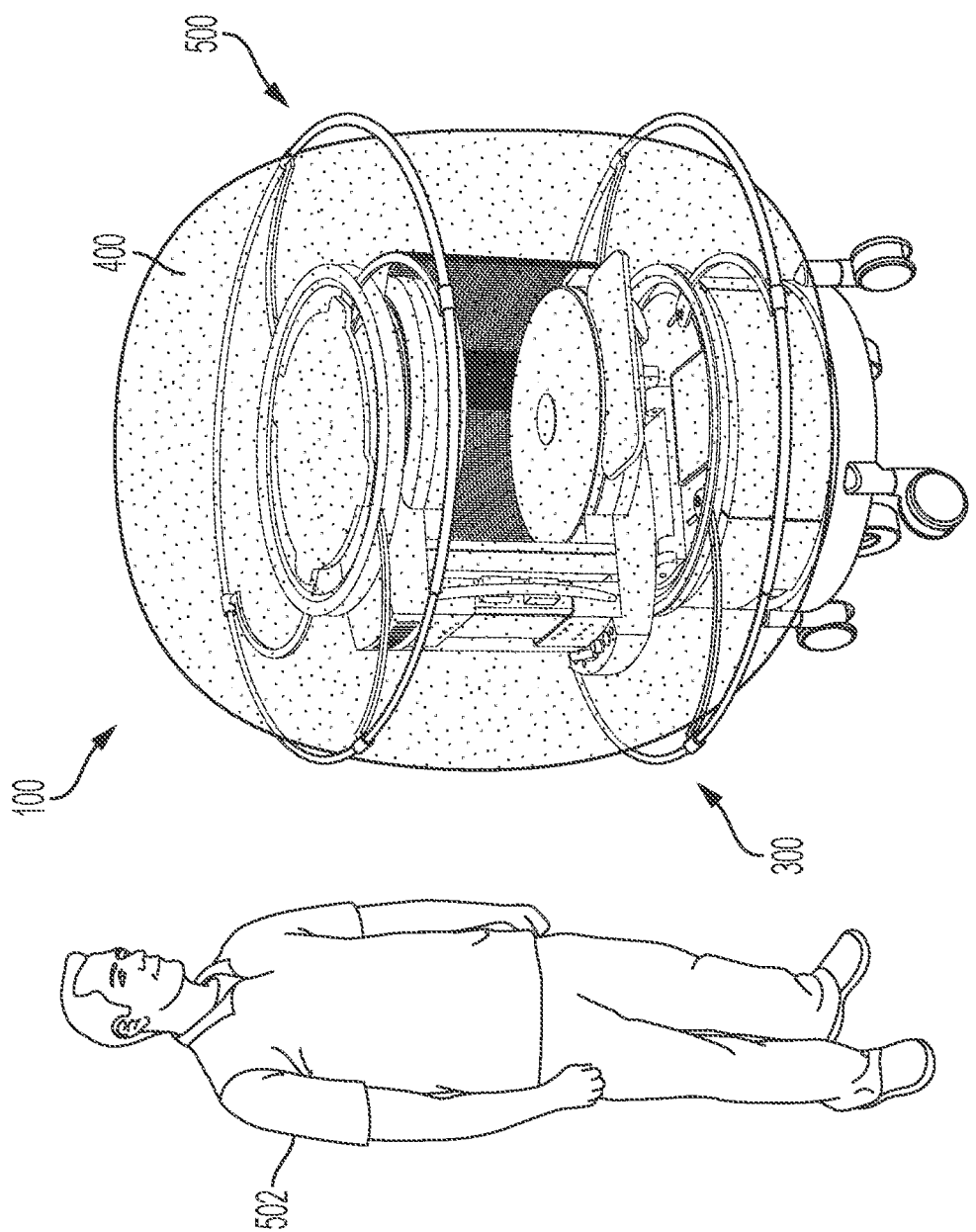
FIG. 5 illustrates the portable medical imaging device of FIG. 1, configured with two hoop-shaped deployable guard devices, in accordance with some embodiments of the technology described herein.

In an alternative embodiment, and as a further measure to inhibit encroachment along an entire vertical height of the region 400, FIG. 5 illustrates an embodiment of the disclosure in which the portable MRI system 100 is configured with a first hoop-shaped deployable guard device 300 and a second hoop-shaped deployable guard device 500, in accordance with some embodiments of the technology described herein. In this manner, both the first deployable guard device 300 and the second deployable guard device 500 extend beyond the boundary of the region 400, which inhibits a bystander 502 from encroaching within the region 400. It should be appreciated that such a configuration having both a first deployable guard device and a second deployable guard device may utilize a deployable guard device according to any embodiment described herein. For example, although FIG. 5 illustrates the first and second deployable guard devices having a "hoop" design, it should be understood that a deployable guard device having a "clover" design as described herein may be used interchangeably in place of first deployable guard device 300, second deployable guard device 500, or both first deployable guard device 300 and second deployable guard device 500.

One or more guard devices may be utilized in a number of ways with respect to a portable MRI system. For example, FIG. 6 illustrates a first exemplary environment for a portable medical imaging device 100 configured with one or more deployable guard devices, in accordance with some embodiments of the technology described herein. As shown in FIG. 6, when the system 100 is in transit (e.g., through a hallway 600 or other common corridor), in storage or in any environment with an uncertain degree of access control, one or more guard devices 300, 500 may be deployed. In contrast, where the system 100 has been brought to and set up within a patient room 700, the room 700 may become the controlled access area through applicable signage 702 that is placed on the room door 704, for example as set forth in IEC 60601-2-33.

Figure 7:
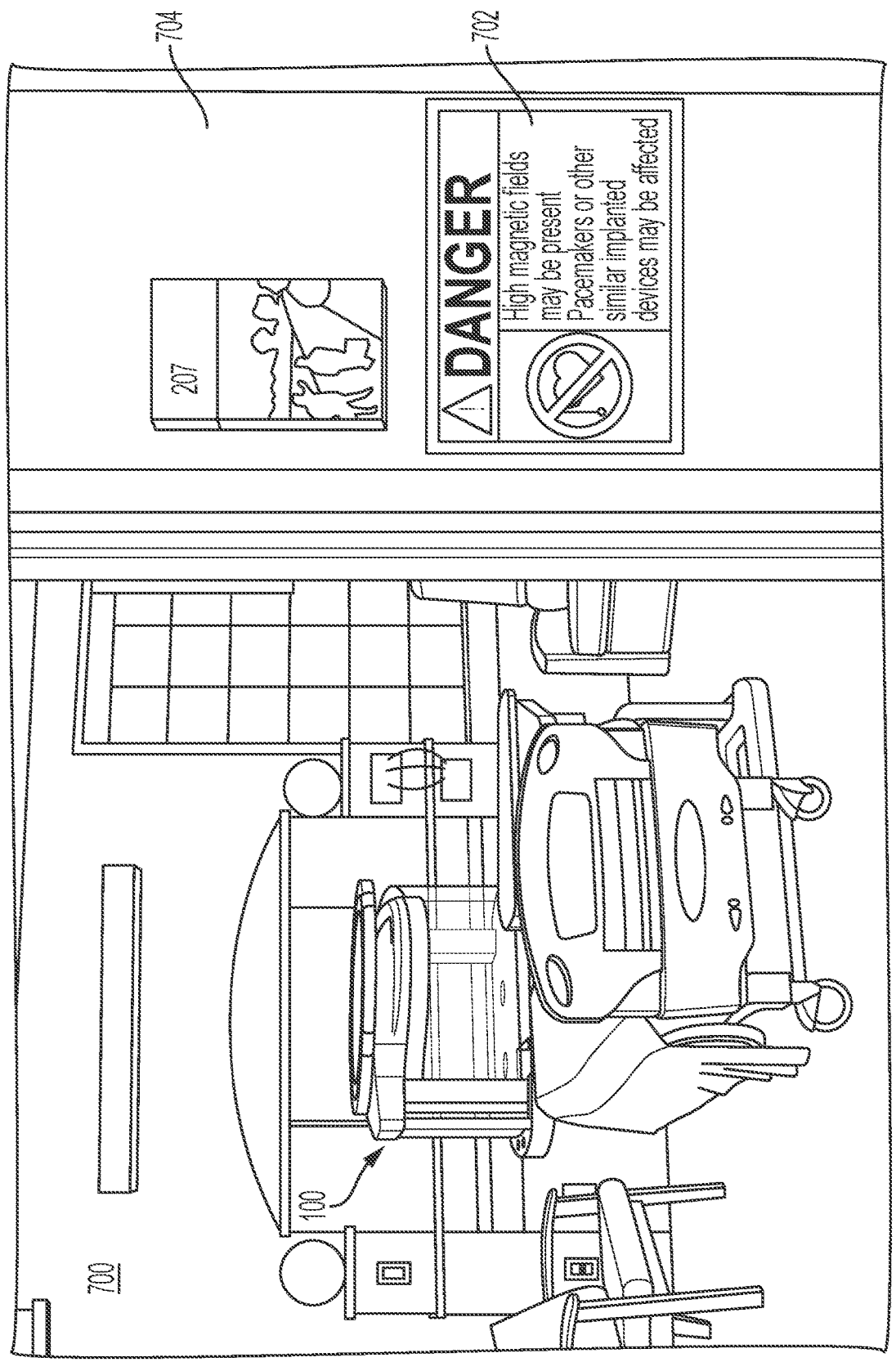
FIG. 7 illustrates a second exemplary environment for a portable medical imaging device configured with one or more deployable guard devices in accordance with some embodiments of the technology described herein.
Figure 8:
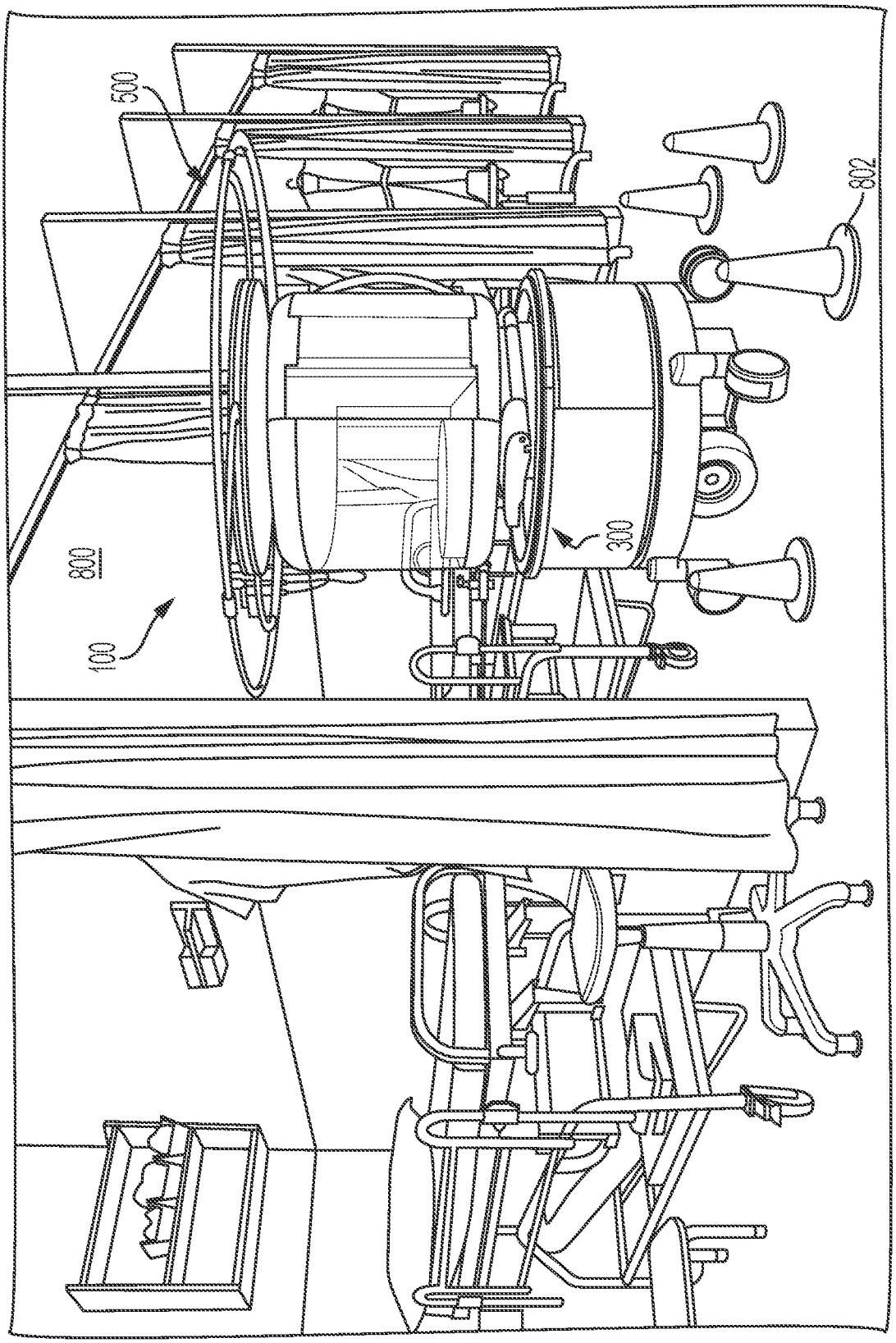
FIG. 8 illustrates a third exemplary environment for a portable medical imaging device configured with one or more deployable guard devices in accordance with some embodiments of the technology described herein.

As illustrated in FIG. 7, there is shown a second exemplary environment for a portable medical imaging device 100 configured with one or more deployable guard devices in accordance with some embodiments of the technology described herein. FIG. 8 illustrates a third exemplary operating environment for a portable MRI system 100 configured with one or more deployable guard devices in accordance with some embodiments of the technology described herein that may represent an intermediate degree of access control between a patient room 700 as illustrated in FIG. 7, and a common environment 600 as illustrated in FIG. 6. Here, the system 100 is set up for scanning in an open area 800. In this exemplary embodiment the upper guard device 500 is configured in the deployed position while the lower guard device 300 is configured in the undeployed position. This may represent a situation, for example, where it is inconvenient for medical personnel to provide care and/or operate the system 100 with the lower guard device 300 deployed. Nonetheless, to maintain desired access control, the upper guard device 500 is deployed and used in combination with one or more cones 802 (and/or other stanchions chains, signs, markers, etc., as appropriate) to delineate an access controlled area. It should be appreciated that the system 100 may be configured having any combination of first and second deployable guards in the undeployed or deployed positions respectively.

Certain configurations of the deployable guard devices as described herein may be preferred for different modes of operation of the portable medical imaging device 100. For example, as previously described above, it may be advantageous to configure the upper guard device, 500 or 501, in the deployed position while the lower guard device, 300 or 301, remains in the undeployed position, when the portable medical imaging device 100 is in a scanning mode. Such a configuration allows for easier access for medical personnel to provide care and/or operate the system 100 while the lower guard device is undeployed. In transit, the portable medical imaging device 100 may pass through an uncontrolled area, such as a hallway. It may be desirable to configure the portable medical imaging device with both upper and lower guards deployed while in transit. While in storage, it may be important to provide the lower guard deployed to protect children from approaching the portable medical imaging device 100 too closely. In addition to deploying the lower guard while in storage, it may be desirable to attach an additional expandable guard that provides a vertical barrier surrounding the portable medical imaging device 100 from the height of the lower guard to the ground. The following explanation is provided by way of example and certain configurations of the upper and lower guards in the deployed and undeployed positions are not limited in this respect.

Figure 9:
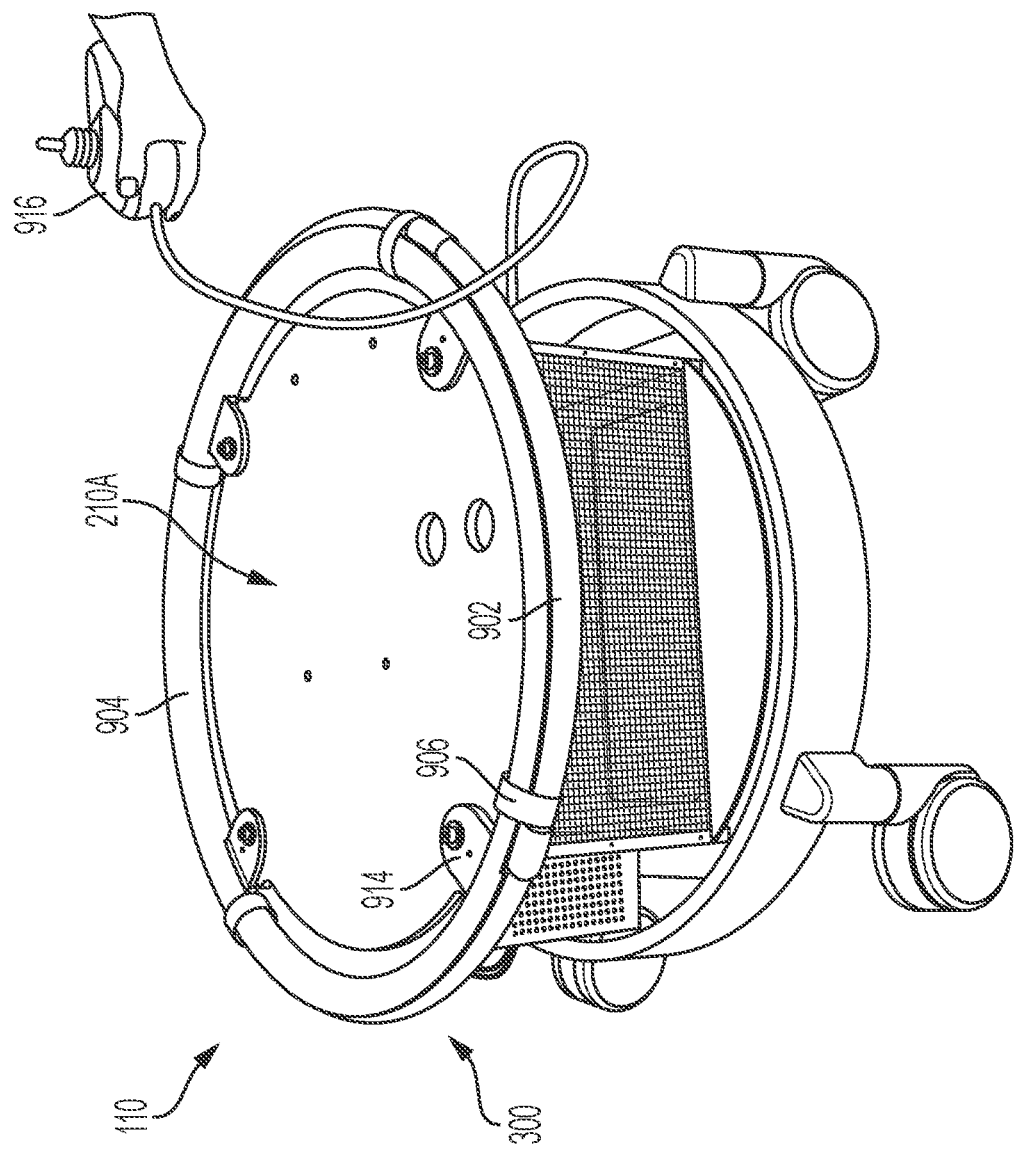
FIG. 9 illustrates a base portion of a portable medical imaging device configured with a deployable guard device in an undeployed position, in accordance with some embodiments of the technology described herein.
Figure 10:
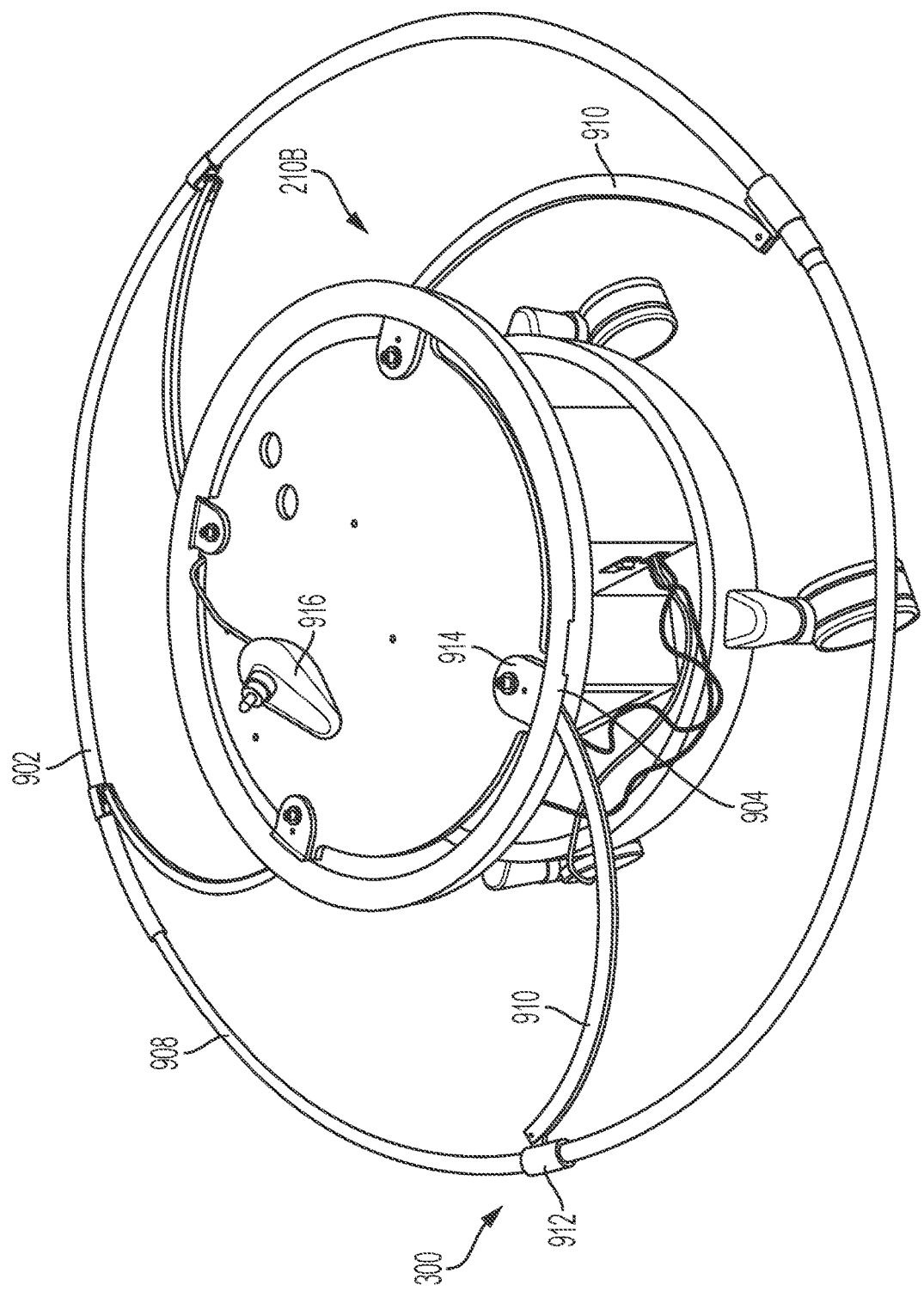
FIG. 10 illustrates the base portion of the medical imaging device of FIG. 9 configured with the deployable guard device having a "hoop" design and in a deployed position, in accordance with some embodiments of the technology described herein.

Referring now to FIGS. 9 and 10, there is shown a base 110 of a MRI system configured with a deployable guard device 300 having a "hoop" design in the undeployed position and in the deployed position, respectively. In the embodiment depicted, the guard device 300 includes an outer rail 902 having a generally circular configuration, although other shapes may be utilized. In the undeployed position shown in FIG. 9, the outer rail 902 has first diameter and may be secured to a support track 904 using a suitable fastening mechanism such as Velcro straps 906 for example. The support track 904 may be secured to a base 110 of the MRI system 100 using one or more mounting tabs 914. The support track 904 may be formed from a material such as stainless steel and comprise a portion of the MRI system base 110, while the outer rail 902 can be formed from PVC, plastic, or other suitable material(s), for example. In particular, the outer rail 902 may be formed from polyethylene.

Figure 11:
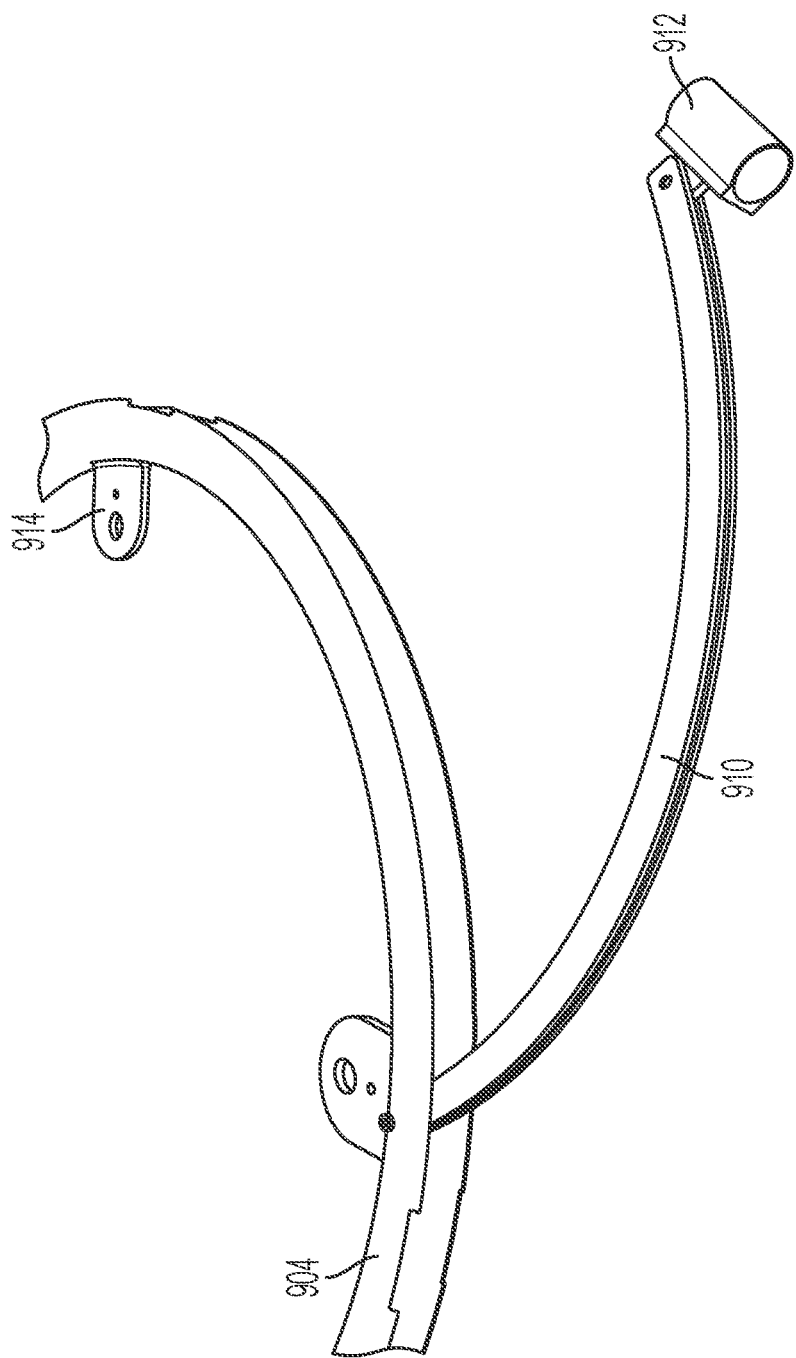
FIG. 11 illustrates a swing arm of a deployable guard device, in accordance with some embodiments of the technology described herein.
Figure 12:
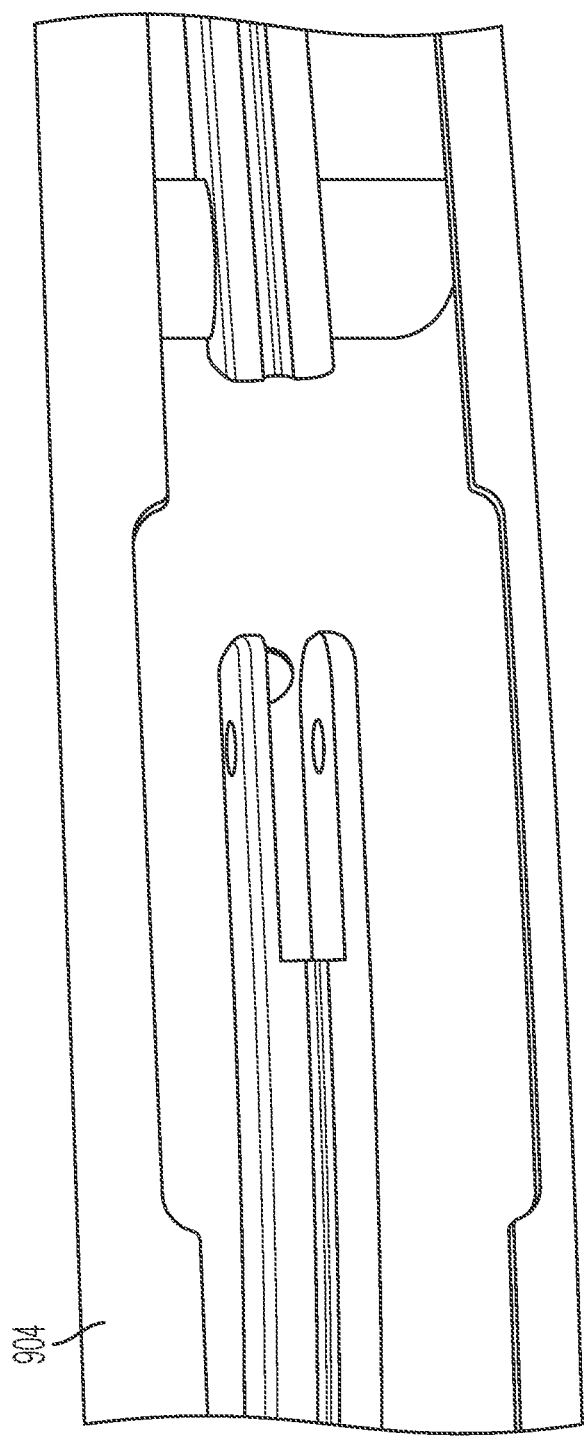
FIG. 12 illustrates a support track of a deployable guard device, in accordance with some embodiments of the technology described herein.

As particularly shown in FIG. 10, the guard device 300 further includes an inner rail 908 that is slidingly engaged within the outer rail 902 in a telescoping manner. Thus configured, the extension of the inner rail 908 in combination with the outer rail 902 increases the effective diameter of the guard 300 when in the deployed position. Conversely, because inner rail 908 is disposed substantially entirely within the outer rail 902 in the undeployed position, it is not visible in FIG. 9. As also shown in FIG. 10, one or more swing arms 910 may be used to support the outer rail 902 as it is moved from the undeployed position to the deployed position. Each swing arm 910 is attached at first end thereof to the support track 904, and a second end thereof to a corresponding hollow collar 912 through which the outer rail 902 passes. As is the case with the inner rail 908, the swing arms 910 are essentially hidden from view in the undeployed position of FIG. 9. This may be accomplished, for example by fashioning the swing arms 910 in a curved shape such that they conform to the shape of the support track 904. FIG. 11 illustrates a more detailed view of the support track 904, swing arm 910 and hollow collar 912, while FIG. 12 illustrates a close up view of an interior portion of the support track 904, at which the first end of the swing arm 910 (not shown in FIG. 12) is affixed. In some embodiments, the one or more swing arms 910 and hollow collars 912 may be formed of aluminum and/or any other suitable material(s). In some embodiments, the one or more swing arms 910, hollow collars 912, support track 904, outer rail 902 and inner rail 908 may all be formed from a plastic material, such as polyethylene, for example.

In some embodiments, the deployable guard device 300 having the "hoop" design comprises an inner portion 604 and an outer portion 602, as seen in FIG. 3A. The inner portion 604 may comprise the support track 904, as described herein. The outer portion 602 may comprise the inner rail 908 and the outer rail 902, as described herein.

In some embodiments of the technology described herein, the deployable guard device 301 may have a "clover" design. The deployable guard device 301 having the "clover" design may be coupled to the base 110 of an MRI system. The deployable guard device 301 may comprise first rail portions 1008 and second rail portions 1002, as shown in FIGS. 3D-3E. First rail portions 1008 and second rail portions 1002 may be formed from a material such as aluminum, for example. The second rail portions 1002 may have a slotted track 1010 having an inner end 1010A and an outer end 1010B. The first rail portions 1008, shown in FIG. 17, may be coupled with the second rail portions 1002 to form arcuate sections 1012A-D. In the illustrated embodiment, the deployable guard device 301 comprises four arcuate sections 1012A-D symmetric with respect to each other, but the inventors have recognized that any suitable number of arcuate sections may be employed.

A sliding end 1008A of each first rail portion 1008 may be coupled to each second rail portion 1002 such that the sliding end 1008A of the first rail portion 1008 may slide along the slotted track 1010 of the second rail portion 1002. For example, the sliding end 1008A of the first rail portion 1008 may move between the inner end 1010A and the outer end 1010B of the slotted track 1010 of the second rail portion 1002. In this way, the arcuate sections 1012A-D of the deployable guard device 301 may be adjusted in length as the sliding end 1008A of the first rail portion 1008 slides between inner and outer ends 1010A, 1010B of the slotted track 1010 of the second rail portion 1002. For example, when the deployable guard device 301 is in the deployed position, the first rail portions 1008 may slide to the outer end 1010B of the slotted track 1010, thereby lengthening the arcuate sections 1012A-D of the deployable guard device 301. When the deployable guard device 301 is in the undeployed position, on the other hand, the sliding end 1008A of the first rail portion 1008 may slide to the inner end 1010A of the slotted track 1010 of the second rail portion 1002, thereby shortening the length of the arcuate sections 1012A-D of the deployable guard device 301.

The deployable guard device 301 may comprise a support track 904 which can be coupled to the base 110 of the MRI system 100 using one or more mounting tabs 914. First rail portions 1008 and second rail portions 1002 may be secured to the support track 904 when the deployable guard device 301 is in the undeployed position. The deployable guard device 301 may further comprise swing arms 910 supporting the first rail portions 1008 and the second rail portions 1002 as they are moved from the undeployed position to the deployed position. Each swing arm 910 is attached at a first end thereof to the support track 904, and second ends thereof are attached to ends of respective arcuate sections 1012A-D. The support track 904 may receive the swing arms 910 such that the swing arms 910 are essentially hidden from view in the undeployed position. This may be accomplished, for example by fashioning the swing arms 910 in a curved shape such that they conform to the shape of the support track 904.

In some embodiments, the deployable guard device 301 having the "clover" design comprises an inner portion 608 and an outer portion 606, as seen in FIG. 3D. The inner portion 608 may comprise the support track 904, as described herein. The outer portion 606 may comprise the first rail portion 1008 and the second rail portion 1002, as described herein.

In some embodiments, the deployable guard device may have an "inflatable guard" design. The deployable guard device having an "inflatable guard" design may comprise an inflatable ring coupled to the MRI system 100. The inflatable ring may be deflated in an undeployed position, and inflated in a deployed position.

The inventors have recognized that the deployable guard device may be moved from the undeployed position to the deployed position and vice versa by mechanical or manual means. In some embodiments wherein the deployable guard device has a "hoop" design, an operator may simply grasp and pull the outer rail 902 in a radially outward direction, exposing the swing arms 910 and inner rail 908 until the guard device 300 reaches its maximum outer diameter. Conversely, the operator may the push the inner rail 902 in radially inward direction until the swing arms 910 are completely within the support track 904 and the and inner rail 908 is completely within the outer rail 902 (as in FIG. 9). In some embodiments wherein the deployable guard device has a "clover" design, an operator may grasp the first rail portion 1008 and the second rail portion 1002 and pull them in a radially outward direction, moving the sliding end 1008A of the first rail portion 1008 from the inner end 1010A of the slotted track 1010 to the outer end 1010B of the slotted track 1010, until the arcuate sections 1012A-D reach a maximum length. Conversely, the operator may push the first rail portion 1008 and the second rail portion 1002 together in a radially inward direction such that the sliding end 1008A of the first rail portion 1008 moves from the outer end 1010B of the slotted track 1010 to the inner end 1010A of the slotted track 1010, until the arcuate sections 1012A-D reach a minimum length.

In some embodiments, the deployable guard device may be expanded (e.g., to move from the undeployed to a deployed position) or contracted (e.g., to move from the deployed to the undeployed position) mechanically (e.g., pneumatically and/or hydraulically). For example, in some embodiments, the guard device may be moved from the undeployed position to the deployed position by providing compressed air that causes outward expansion of the inner and outer rails 908, 902 and, conversely the application of vacuum pressure to retract the inner and outer rails 908, 902. In some embodiments, the guard device 300 may be moved from the undeployed position to the deployed position and vice versa pneumatically by one or more pistons (e.g., arranged in the support track 904 of the deployable guard device 300 having a "hoop" design). Moving the deployable guard device between the undeployed position and the deployed position may comprise either of the techniques described herein, or a combination of each technique, as the technology is not limited in this respect. The inventors have further recognized that these techniques may be used with a deployable guard device according to any of the embodiments of the technology described herein, such as a deployable guard device having a "hoop" design, a deployable guard device having a "clover" design, or a deployable guard having an "inflatable guard" design.

In some embodiments, the operator may mechanically move the deployable guard device 300 between undeployed and deployed positions by pressing a button. The button may be located anywhere such as on the deployable guard device 300, on the MRI system 100, or on an external device such as a controller 916 coupled to the deployable guard device 300 and/or the MRI system 100. In some embodiments, the deployable guard device 300 may automatically move between undeployed and deployed positions, for example, in response to an event. The event may be any number of events which may include, for example, one or more of turning on the MRI system 100, turning off the MRI system 100, beginning to perform a scanning operation, deploying/undeploying a second deployable guard device 500, applying a manual force to the deployable guard device 300, or in response to sensing a bystander is beginning to approach the MRI system 100.

In some embodiments, the deployable guard device 300 may be implemented in combination with one or more sensors, such as a light or audio signal indicating when a bystander is approaching the deployable guard device. The sensor(s) may serve as a further indication, in addition to the physical barrier provided by the deployable guard device, that the bystander is approaching a region with higher strength fringe fields that may be dangerous to the bystander if entered.

The inventors have appreciated that there are several advantages to employing the deployable guard device in accordance with the embodiments described herein. The deployable guard device according to the embodiments described herein can be configured to remain coupled to the portable medical imaging device 100 during all modes of operation of the device 100. For example, the portable medical imaging device 100 may be have a scanning mode, a transit mode, and a storage mode. The deployable guard device according to the above-described embodiments is configured to be coupled to the deployable guard device and capable of moving between deployed and undeployed positions. Therefore, the deployable guard device can easily move with the portable medical imaging device 100 between modes of operation without the need to remove or reinstall the deployable guard device. In addition, the deployable guard device according to the embodiments described herein may be easy to transport, easy to store, and relatively inexpensive to manufacture.

Although the deployable guard device has been described herein as having a deployed position and undeployed position, the inventors have appreciated that in some embodiments, there may be a sequence of different deployed positions. A deployable guard device having a sequence of different deployed positions may be configured to prevent encroachment to respective regions of different sizes. For example, the sequence of deployed positions may comprise a first deployed position substantially corresponding to a 10 Gauss line, a second deployed position substantially corresponding to a 5 Gauss line, and a third position corresponding to a 1 Gauss line. The sequence of different deployed positions may be implemented using a deployable guard device according to any of the embodiments of the technology described herein.

FIGS. 13A-E illustrate views of a deployable guard device 301 having a "clover" design, including views of the guard in deployed and undeployed configurations, in accordance with some embodiments of the technology described herein. FIG. 13A illustrates a top view of the deployable guard device 301 in the deployed position. FIG. 13B illustrates a cross-sectional view of the deployable guard device 301 in the undeployed position. FIG. 13C illustrates a side view of the deployable guard device 301 in the undeployed position. FIG. 13D illustrates a top view of the deployable guard device 301 in the undeployed position. FIG. 13E illustrates an isometric view of the deployable guard device 301 in the undeployed position.

FIGS. 14A-D illustrate views of a support track 904 of deployable guard device 301, in accordance with some embodiments of the technology described herein. FIG. 14A illustrates a side view of the support track 904 of deployable guard device 301. FIG. 14B illustrates a cross-sectional view along the line B-B of the support track 904 of deployable guard device 301. FIG. 14C illustrates a top view of the support track 904 of deployable guard device 301. FIG. 14D illustrates an isometric view of the support track 904 of deployable guard device 301.

Figure 15A:
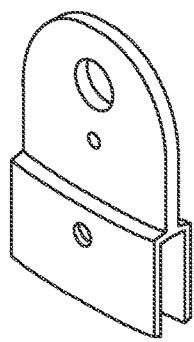
FIGS. 15A-D illustrate views of a mounting tab of a deployable guard device having a "clover" design, in accordance with some embodiments of the technology described herein.
Figure 15B:
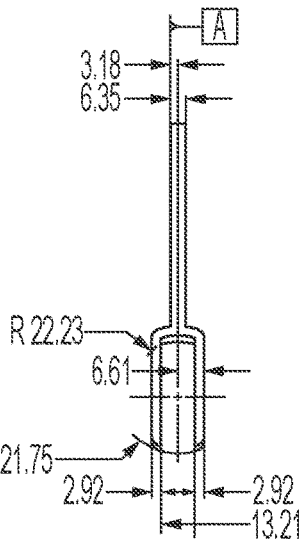
Figure 15C:
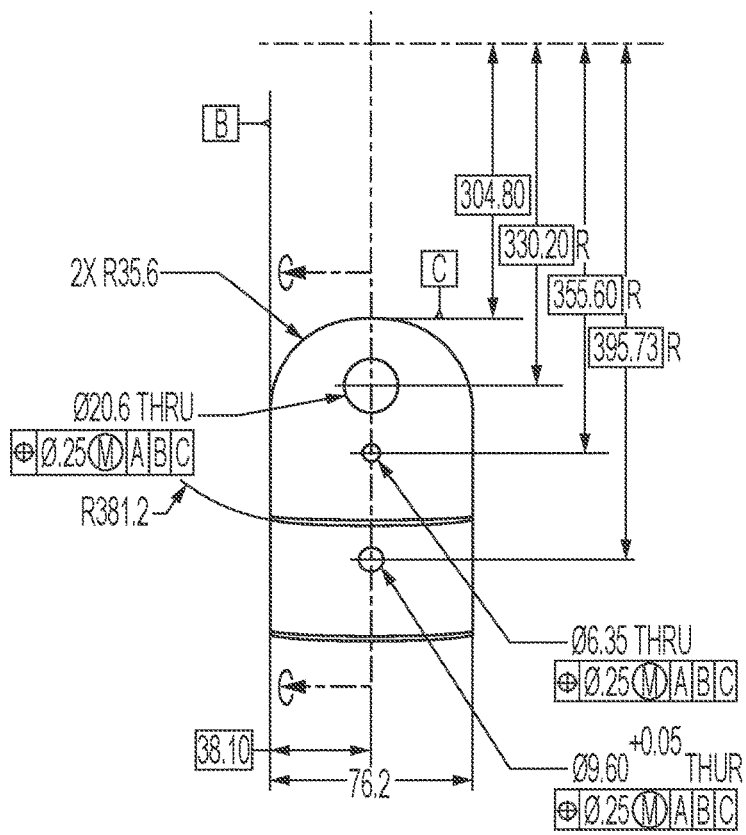
Figure 15D:
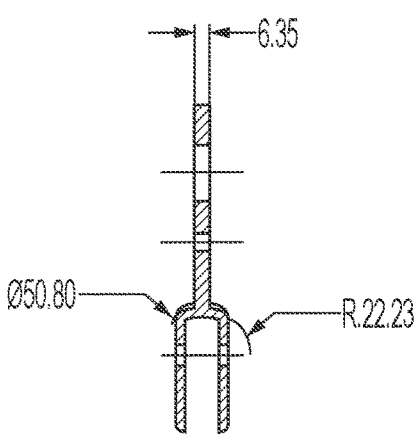

FIGS. 15A-D illustrate views of a mounting tab 914 of a deployable guard device 301. FIG. 15A illustrates an isometric view of the mounting tab 914 of deployable guard device 301. FIG. 15B illustrates a side view of the mounting tab 914 of deployable guard device 301. FIG. 15C illustrates a front view of the mounting tab 914 of deployable guard device 301. FIG. 15D illustrates a cross-sectional view along the line C-C of the mounting tab 914 of deployable guard device 301.

FIGS. 16A-C illustrate views of a swing arm 910 of deployable guard device 301, in accordance with some embodiments of the technology described herein. FIG. 16A illustrates a front view of the swing arm 910 of deployable guard device 301. FIG. 16B illustrates a side view of the swing arm 910 of deployable guard device 301. FIG. 16C illustrates a side view of the swing arm 910 of deployable guard device 301.

Figures 17A, 17B:
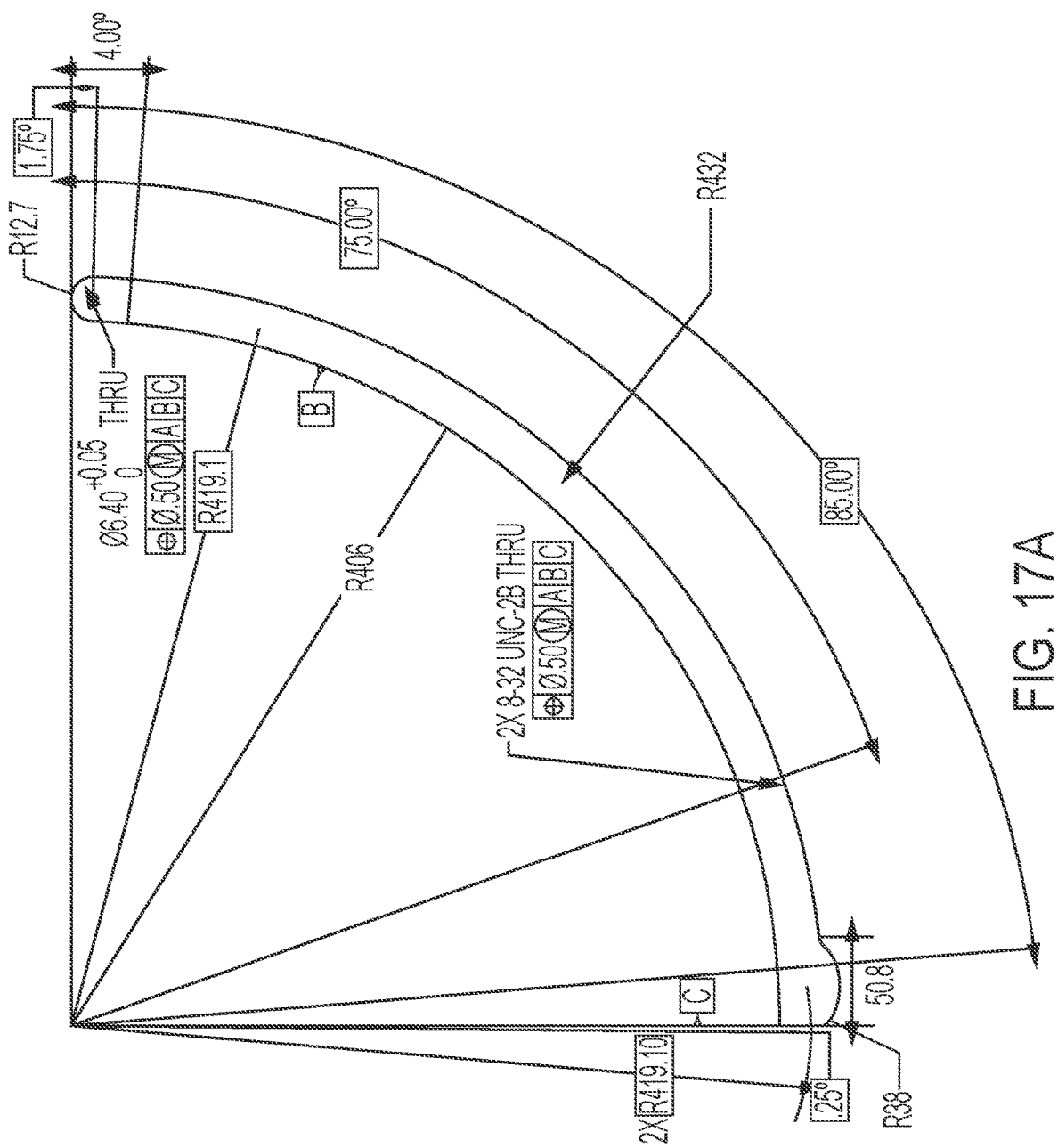
FIGS. 17A-B illustrate views of a rail portion of a deployable guard device having a "clover" design, in accordance with some embodiments of the technology described herein.

FIGS. 17A-B illustrate views of a rail portion 1008 of deployable guard device 301, in accordance with some embodiments of the technology described herein. FIG. 17A illustrates a front view of the first rail portion 1008 of the deployable guard device 301. FIG. 17B illustrates a side view of the first rail portion 1008 of the deployable guard device 301.

FIG. 18A-C illustrate views of another rail portion 1002 of the deployable guard device 301, in accordance with some embodiments of the technology described herein. FIG. 18A illustrates a cross-sectional view along the line E-E of the second rail portion 1002 of the deployable guard device 301. FIG. 18B illustrates a front view of the second rail portion 1002 of the deployable guard device 301. FIG. 18C illustrates a side view of the second rail portion 1002 of the deployable guard device 301.

FIGS. 19A-F illustrate views of a deployable guard device 300 having a "hoop" design, in accordance with some embodiments of the technology described herein. FIG. 19A illustrates a front view of the deployable guard device 300 in the deployed position. FIG. 19B illustrates a front view of the deployable guard device 300 in the undeployed position. FIG. 19C illustrates an isometric view of the deployable guard device 300 in the undeployed position. FIG. 19D illustrates a cross-sectional view along the line B-B of the deployable guard device 300 in the undeployed position. FIG. 19E illustrates a cross-sectional view along the line A-A of the deployable guard device 300 in the undeployed position. FIG. 19F illustrates a side view of the deployable guard device 300 in the undeployed position.

Figure 20D:
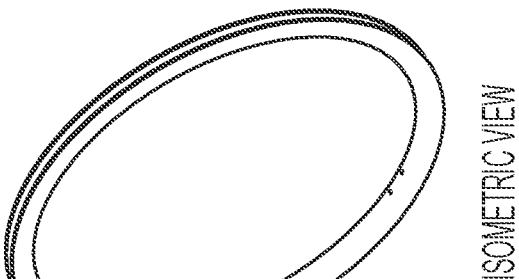
FIGS. 20A-D illustrate views a support track of the deployable guard device having a "hoop" design, in accordance with some embodiments of the technology described herein.
Figure 20A:
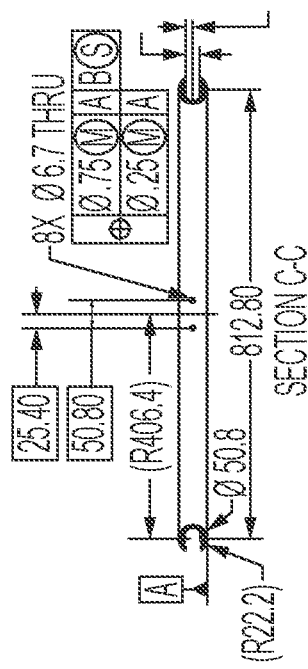
Figure 20C:
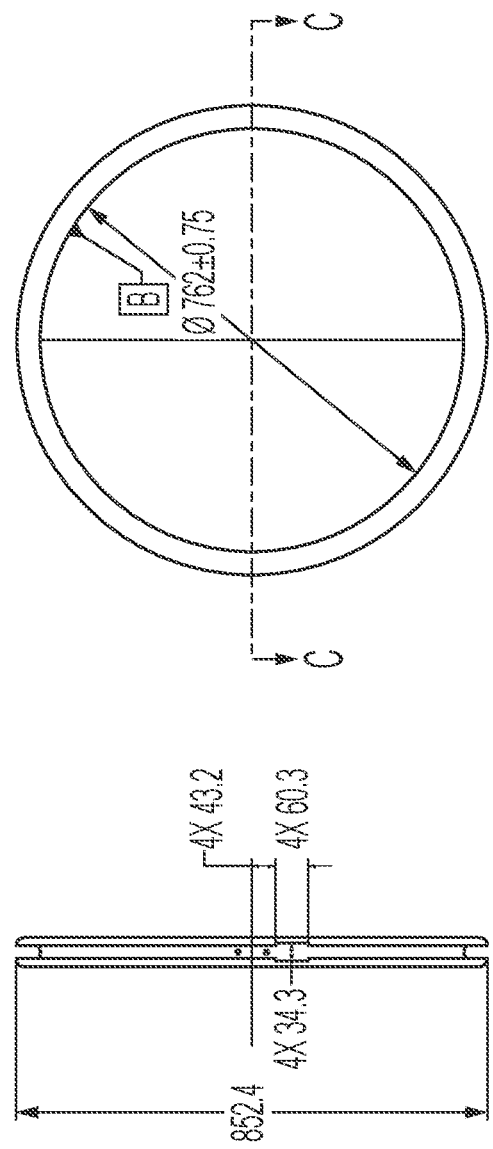
Figure 20B:
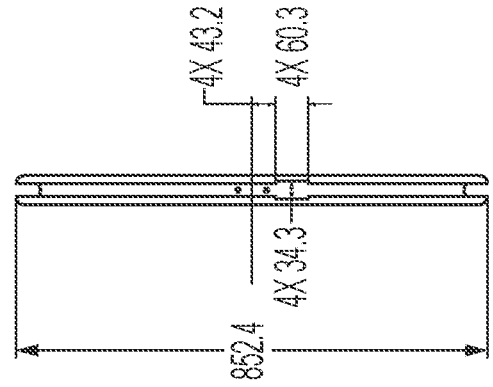

FIGS. 20A-D illustrate views a support track 904 of the deployable guard device 300, in accordance with some embodiments of the technology described herein. FIG. 20A illustrates a cross-sectional view along the line C-C of the support track 904 of the deployable guard device 300. FIG. 20B illustrates a side view of the support track 904 of the deployable guard device 300. FIG. 20C illustrates a front view of the support track 904 of the deployable guard device 300. FIG. 20D illustrates an isometric view of the support track 904 of the deployable guard device 300.

FIGS. 21A-E illustrate views of a mounting tab 914 of a deployable guard device 300, in accordance with some embodiments of the technology described herein. FIG. 21A illustrates a side view of the mounting tab 914 of the deployable guard device 300. FIG. 21B illustrates a front view of the mounting tab 914 of the deployable guard device 300. FIG. 21C illustrates a cross-sectional view along the line D-D of the mounting tab 914 of the deployable guard device 300. FIG. 21D illustrates a bottom view of the mounting tab 914 of the deployable guard device 300. FIG. 21E illustrates an isometric view of the mounting tab 914 of the deployable guard device 300.

FIGS. 22A-C illustrate views of a swing arm 910 of a deployable guard device 300, in accordance with some embodiments of the technology described herein. FIG. 22A illustrates a side view of the swing arm 910 of the deployable guard device 300. FIG. 22B illustrates a cross-sectional view along the line E-E of the swing arm 910 of the deployable guard device 300. FIG. 22C illustrates a front view of the swing arm 910 of the deployable guard device 300.

FIGS. 23A-D illustrate views of a hinge having ball detents of a support track of a deployable guard device 300, in accordance with some embodiments of the technology described herein. FIG. 23A illustrates a cross-sectional view along the line F-F of the hinge having ball detents of the support track of the deployable guard device 300. FIG. 23B illustrates a side view of the hinge having ball detents of the support track of the deployable guard device 300. FIG. 23C illustrates an isometric view of the hinge having ball detents of the support track of the deployable guard device 300. FIG. 23D illustrates a front view of the hinge having ball detents of the support track of the deployable guard device 300. FIG. 23E illustrates a rear view of the hinge having ball detents of the support track of the deployable guard device 300. FIG. 23F illustrates a top view of the hinge having ball detents of the support track of the deployable guard device 300. FIG. 23G illustrates a second side view of the hinge having ball detents of the support track of the deployable guard device 300. FIG. 23H illustrates a cross-sectional view along the line G-G of the hinge having ball detents of the support track of the deployable guard device 300.

Figure 24A:
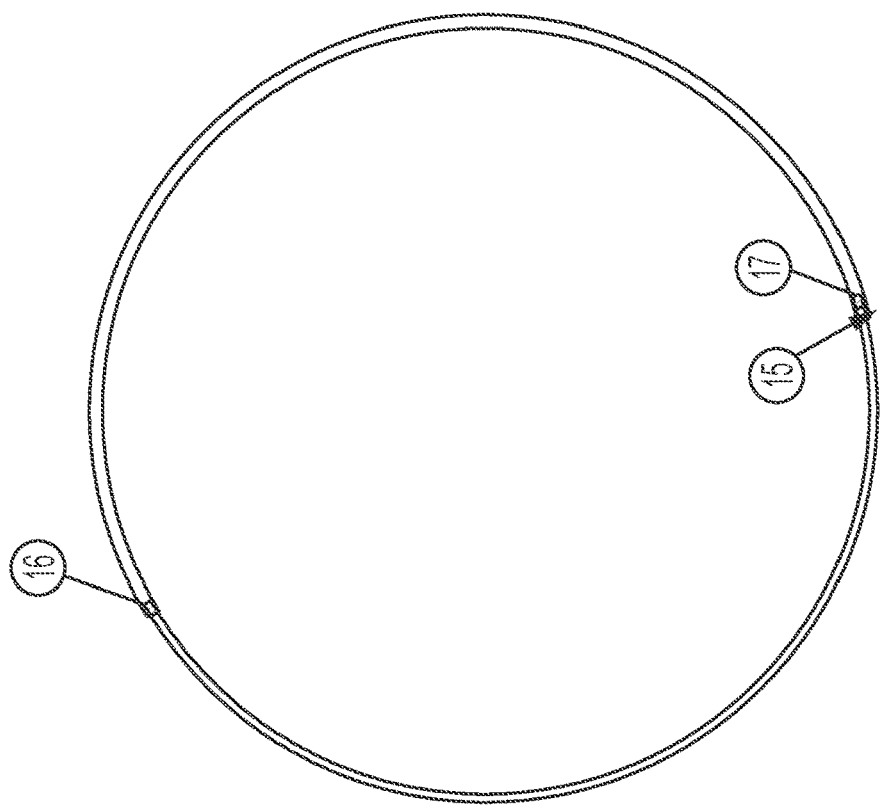
FIGS. 24A-C illustrate views of inner and outer rails of a deployable guard device having a "hoop" design, in accordance with some embodiments of the technology described herein.
Figure 24B:
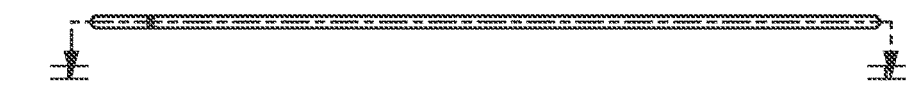
Figure 24C:
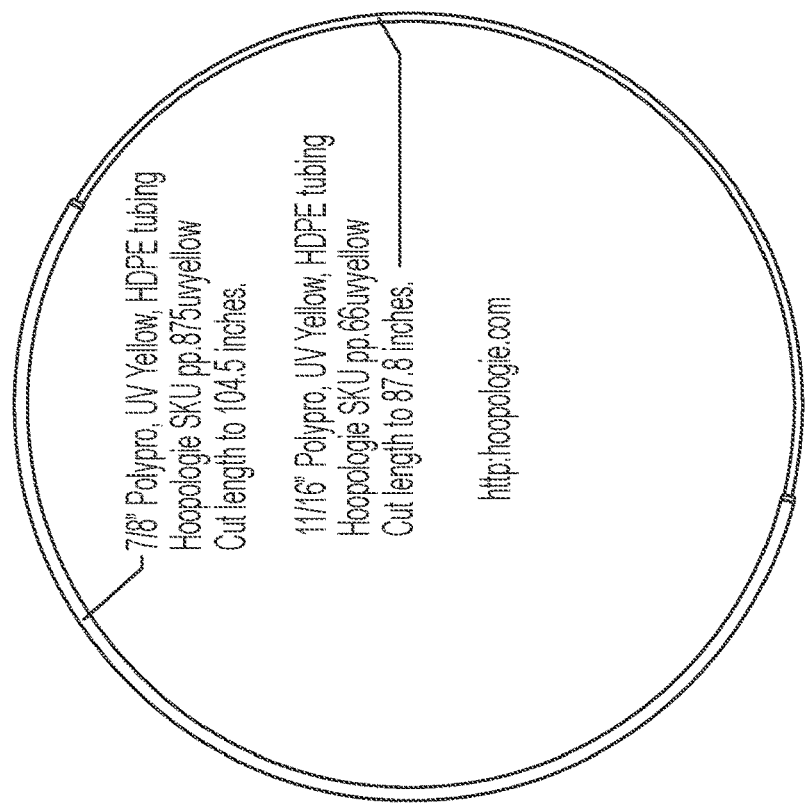

FIGS. 24A-C illustrate views of inner and outer rails 908, 902 of a deployable guard device 300, in accordance with some embodiments of the technology described herein. FIG. 24A illustrates a top view of inner and outer rails 908, 902 of the deployable guard device 300. FIG. 24B illustrates a side view of inner and outer rails 908, 902 of the deployable guard device 300. FIG. 24C illustrates a bottom view 908, 902 of inner and outer rails of the deployable guard device 300.

The above-described embodiments can be implemented in any of numerous ways. For example, the embodiments may be implemented using hardware, software or a combination thereof. When implemented in software, the software code can be executed on any suitable processor (e.g., a microprocessor) or collection of processors, whether provided in a single computing device or distributed among multiple computing devices. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

In this respect, it should be appreciated that one implementation of the embodiments described herein comprises at least one computer-readable storage medium (e.g., RAM, ROM, EEPROM, flash memory or other memory technology, CD-ROM, digital versatile disks (DVD) or other optical disk storage, magnetic cassettes, magnetic tape, magnetic disk storage or other magnetic storage devices, or other tangible, non-transitory computer-readable storage medium) encoded with a computer program (i.e., a plurality of executable instructions) that, when executed on one or more processors, performs the above-discussed functions of one or more embodiments. The computer-readable medium may be transportable such that the program stored thereon can be loaded onto any computing device to implement aspects of the techniques discussed herein. In addition, it should be appreciated that the reference to a computer program which, when executed, performs any of the above-discussed functions, is not limited to an application program running on a host computer. Rather, the terms computer program and software are used herein in a generic sense to reference any type of computer code (e.g., application software, firmware, microcode, or any other form of computer instruction) that can be employed to program one or more processors to implement aspects of the techniques discussed herein.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. An apparatus comprising:
a deployable guard device configured to be coupled to a portable magnetic resonance imaging device and, when deployed, inhibit encroachment within a physical boundary with respect to the portable magnetic resonance imaging device, wherein:
when in an undeployed position, the deployable guard device defines a first inner region having a first area,
when in a deployed position, the deployable guard device defines a second inner region having a second area larger than the first area, and
when in the deployed position, the deployable guard device extends radially further from an imaging region of the portable magnetic resonance imaging device than when the deployable guard device is in the undeployed position.

2. The apparatus of claim 1, wherein deployable guard device comprises an extendible rail having a first diameter in the undeployed position, and a second diameter in the deployed position, and the second diameter is greater than the first diameter.

3. The apparatus of claim 2, wherein the extendible rail further comprises:
an outer rail; and
an inner rail slidingly engaged within the outer rail in a telescoping manner, such that in the undeployed position, the inner rail is disposed substantially entirely within the outer rail, and, in the deployed position, at least a portion of the inner rail is exposed.

4. The apparatus of claim 3, wherein the deployable guard device further comprises:
a support track, configured to be secured to the portable magnetic resonance imaging device; and
one or more swing arms, connected at a first end thereof to the support track and connected to the outer rail at a second end thereof.

5. The apparatus of claim 4, wherein the second end of the one or more swing arms is extended in a radially outward direction from the support track in the deployed position.

6. The apparatus of claim 1, wherein the physical boundary corresponds to a volume that encompasses a region having a defined magnetic field strength within a range from about 1 Gauss to about 30 Gauss.

7. The apparatus of claim 1, wherein the physical boundary corresponds to a volume that encompasses a region having a defined magnetic field strength within a range from about 5 Gauss to about 20 Gauss.

8. The apparatus of claim 1, wherein the deployable guard device is substantially radially symmetrical.

9. The apparatus of claim 1, wherein the deployable guard device further comprises:
multiple arcuate sections, including a first arcuate section, wherein when the deployable guard device is in the deployed position, a first point on the first arcuate section is at a first distance from an isocenter of the deployable guard device, and a second point on the first arcuate section is at a second distance from the isocenter, and wherein the first and second distances are different from each other.

10. The apparatus of claim 9, wherein the multiple arcuate sections each comprise a first rail and a second rail slidingly engaged with the first rail.

11. The apparatus of claim 10, wherein the first rail comprises a slotted track configured to receive the second rail.

12. The apparatus of claim 1, further comprising at least one light that, when the deployable guard device is in the deployed position, provides an indication of the presence of a magnetic field.

13. An apparatus comprising:
a deployable guard device configured to be coupled to a portable magnetic resonance imaging device, the deployable guard device further configured to, when deployed, demarcate a boundary within which a magnetic field strength of a magnetic field generated by the portable magnetic resonance imaging device equals or exceeds a given threshold, wherein:

when in a deployed position, the deployable guard device extends radially further from an imaging region of the portable magnetic resonance imaging device than when the deployable guard device is in an undeployed position; and the deployable guard device is configured to automatically move between the undeployed position and the deployed position in response to application of a force on the deployable guard device.

14. The apparatus of claim 13, wherein the deployable guard device comprises an extendible rail having a first diameter in the undeployed position, and a second diameter in the deployed position, and the second diameter is greater than the first diameter.

15. The apparatus of claim 13, wherein the physical boundary corresponds to a volume that encompasses a region having a defined magnetic field strength within a range from about 1 Gauss to about 30 Gauss.

16. The apparatus of claim 13, wherein the deployable guard device is substantially radially symmetrical.

17. The apparatus of claim 13, wherein the deployable guard device further comprises:

multiple arcuate sections, including a first arcuate section, wherein when the deployable guard device is in the deployed position, a first point on the first arcuate section is at a first distance from an isocenter of the deployable guard device, and a second point on the first arcuate section is at a second distance from the isocenter, and wherein the first and second distances are different from each other.

18. The apparatus of claim 13, further comprising at least one light that, when the deployable guard device is in the deployed position, provides an indication of the presence of a high-strength magnetic field.

19. The apparatus of claim 13, wherein the force comprises a manual force.

20. A method for using a deployable guard device coupled to a portable magnetic resonance imaging device, the deployable guard device further configured to, when deployed, demarcate a boundary within which a magnetic field strength of a magnetic field generated by the portable magnetic resonance imaging device equals or exceeds a given threshold, the method comprising:

applying a first force to the deployable guard device, wherein the first force causes the deployable guard device to automatically move from an undeployed position to a deployed position, wherein:

when in the deployed position, the deployable guard device extends radially further from an imaging region of the portable magnetic resonance imaging device than when the deployable guard device is in the undeployed position; and applying a second force to the deployable guard device, wherein the second force causes the deployable guard device to automatically move from the deployed position to the undeployed position.

21. The method of claim 20, further comprising, subsequent to applying the second force to the deployable guard device, imaging, using the portable magnetic resonance imaging device.

22. The method of claim 20, wherein the first force comprises a first manual force and the second force comprises a second manual force.

* * * * *